US012369385B2

(12) United States Patent
Cheng

(10) Patent No.: US 12,369,385 B2
(45) Date of Patent: *Jul. 22, 2025

(54) PLURAL GATE OXIDE STRUCTURES WITH DIFFERENT THICKNESSES IN SEMICONDUCTOR DEVICES

(71) Applicant: Taiwan Semiconductor Manufacturing Company, Ltd.

(72) Inventor: Chung-Liang Cheng, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/600,216

(22) Filed: Mar. 8, 2024

(65) Prior Publication Data
US 2024/0213098 A1    Jun. 27, 2024

Related U.S. Application Data

(63) Continuation of application No. 17/875,751, filed on Jul. 28, 2022, now Pat. No. 11,961,766, which is a
(Continued)

(51) Int. Cl.
H10D 84/01        (2025.01)
H10D 30/67        (2025.01)
(Continued)

(52) U.S. Cl.
CPC ..... H10D 84/0144 (2025.01); H10D 30/6735 (2025.01); H10D 30/6757 (2025.01);
(Continued)

(58) Field of Classification Search
CPC ..... H01L 21/823412; H01L 21/823431; H01L 21/823437; H01L 21/823462;
(Continued)

(56) References Cited

U.S. PATENT DOCUMENTS 9,105,490 B2    8/2015  Wang et al.
9,236,267 B2    1/2016  De et al.
(Continued)

FOREIGN PATENT DOCUMENTS

CN        1620718 A       5/2005
CN      106328539 A       1/2017
WO    WO-03073491 A1      9/2003

OTHER PUBLICATIONS

Office Action directed to related Taiwanese Patent Application No. 110116465, mailed Apr. 25, 2022; 4 pages.
(Continued)

Primary Examiner — Cheung Lee
(74) Attorney, Agent, or Firm — Sterne, Kessler, Goldstein & Fox P.L.L.C.

(57) ABSTRACT

A semiconductor device with different gate structure configurations and a method of fabricating the same are disclosed. The method includes forming first and second nanostructured channel regions on first and second fin structures, forming first and second oxide layers with first and second thicknesses, forming a dielectric layer with first and second layer portions on the first and second oxide layers, forming first and second capping layers with first and second oxygen diffusivities on the first and second layer portions, growing the first and second oxide layers to have third and fourth thicknesses, and forming a gate metal fill layer over the dielectric layer. The first and second thicknesses are substantially equal to each other and the first and second oxide layers surround the first and second nanostructured channel regions. The second oxygen diffusivity is higher than the first oxygen diffusivity. The fourth thickness is greater than the third thickness.

20 Claims, 31 Drawing Sheets

Related U.S. Application Data continuation of application No. 17/197,936, filed on Mar. 10, 2021, now Pat. No. 11,430,701.

(60) Provisional application No. 63/083,216, filed on Sep. 25, 2020.

(51) Int. Cl.
*H10D 62/10* (2025.01)
*H10D 64/27* (2025.01)
*H10D 84/03* (2025.01)

(52) U.S. Cl.
CPC ......... *H10D 62/118* (2025.01); *H10D 64/514* (2025.01); *H10D 84/0128* (2025.01); *H10D 84/0135* (2025.01); *H10D 84/0158* (2025.01); *H10D 84/0181* (2025.01); *H10D 84/0193* (2025.01); *H10D 84/038* (2025.01)

(58) Field of Classification Search
CPC ..... H01L 21/823821; H01L 21/823857; H01L 27/088; H01L 27/0886; H01L 27/0924; H01L 29/0665; H01L 29/0673; H01L 29/1079; H01L 29/401; H01L 29/42364; H01L 29/42376; H01L 29/42392; H01L 29/513; H01L 29/66439; H01L 29/775; H01L 29/78696; B82Y 10/00; H10D 64/514; H10D 84/01; H10D 84/0144; H10D 84/038

See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,734,286 B1 | 8/2020 | Ando et al. |
| 2017/0005195 A1 | 1/2017 | Ching et al. |
| 2019/0131415 A1 | 5/2019 | Cheng et al. |
| 2022/0102218 A1 | 3/2022 | Cheng et al. |
| 2023/0015886 A1 | 1/2023 | Cheng et al. |

OTHER PUBLICATIONS

First Office Action, Feb. 18, 2025, 11 pages, Application No. 2021108736526, China.

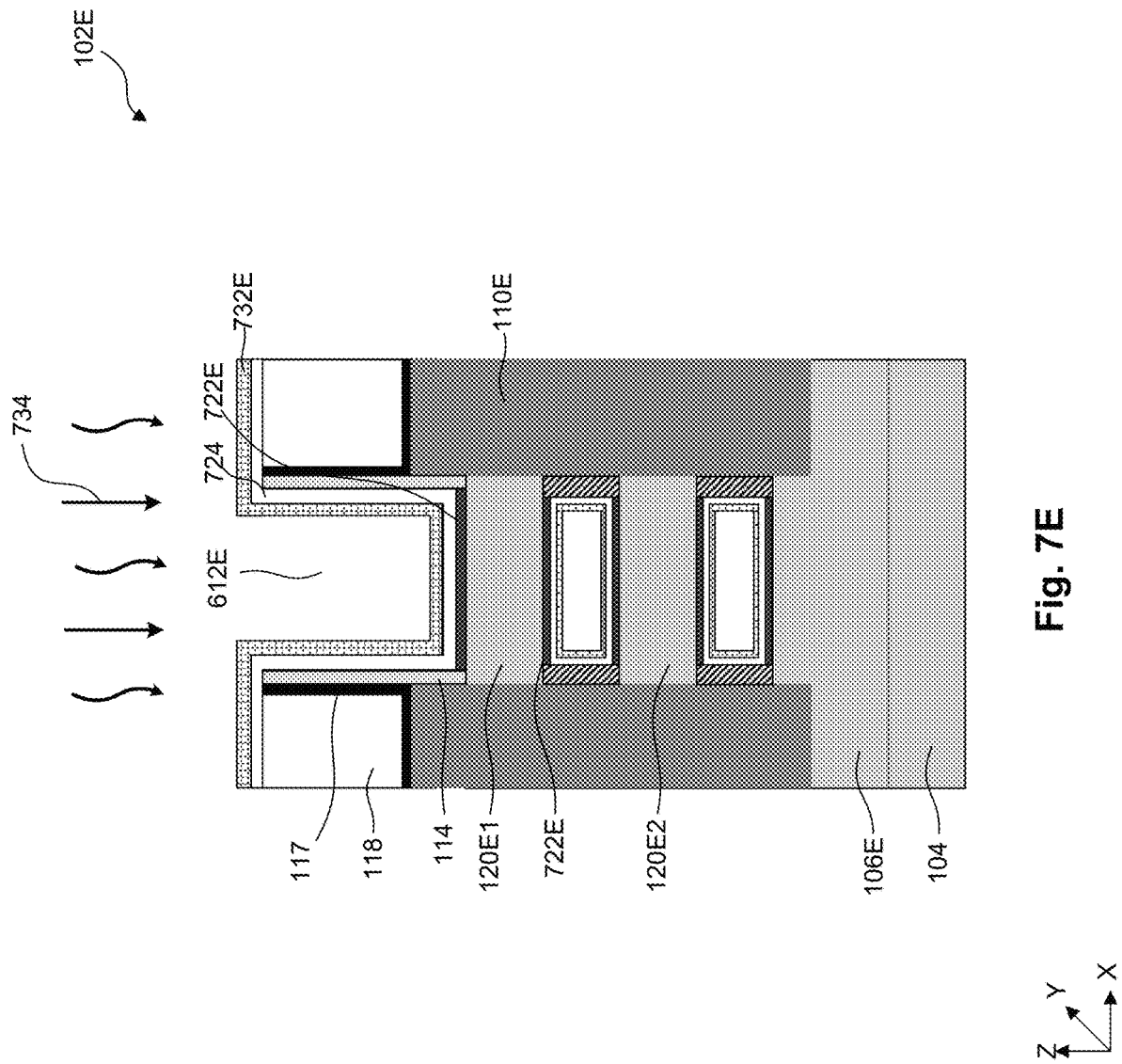

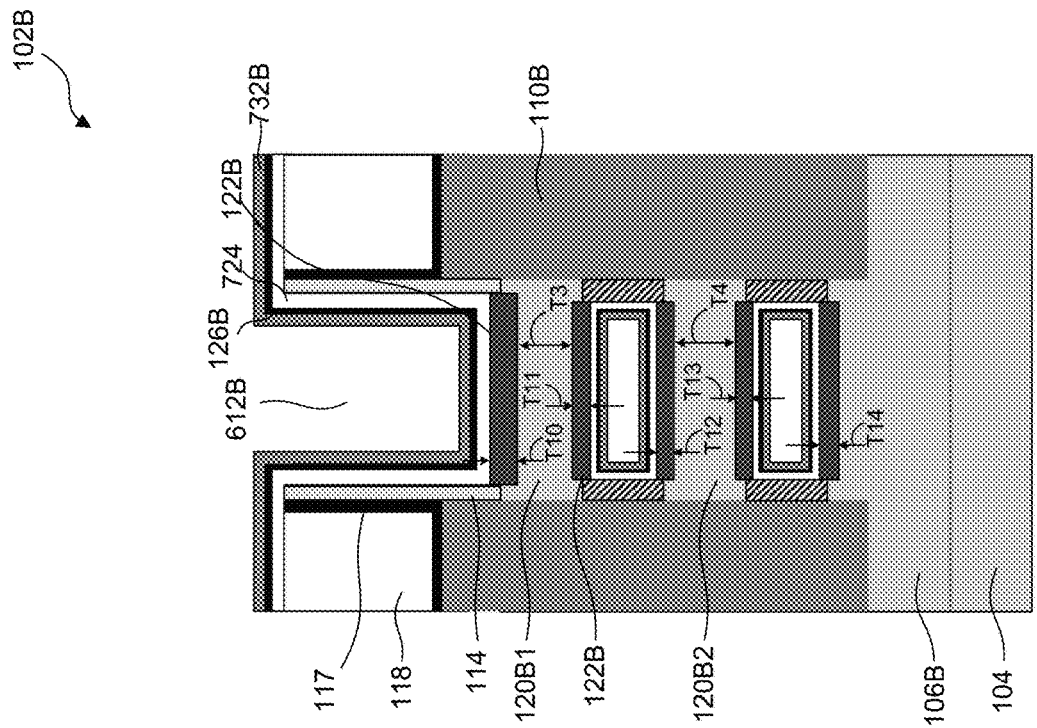
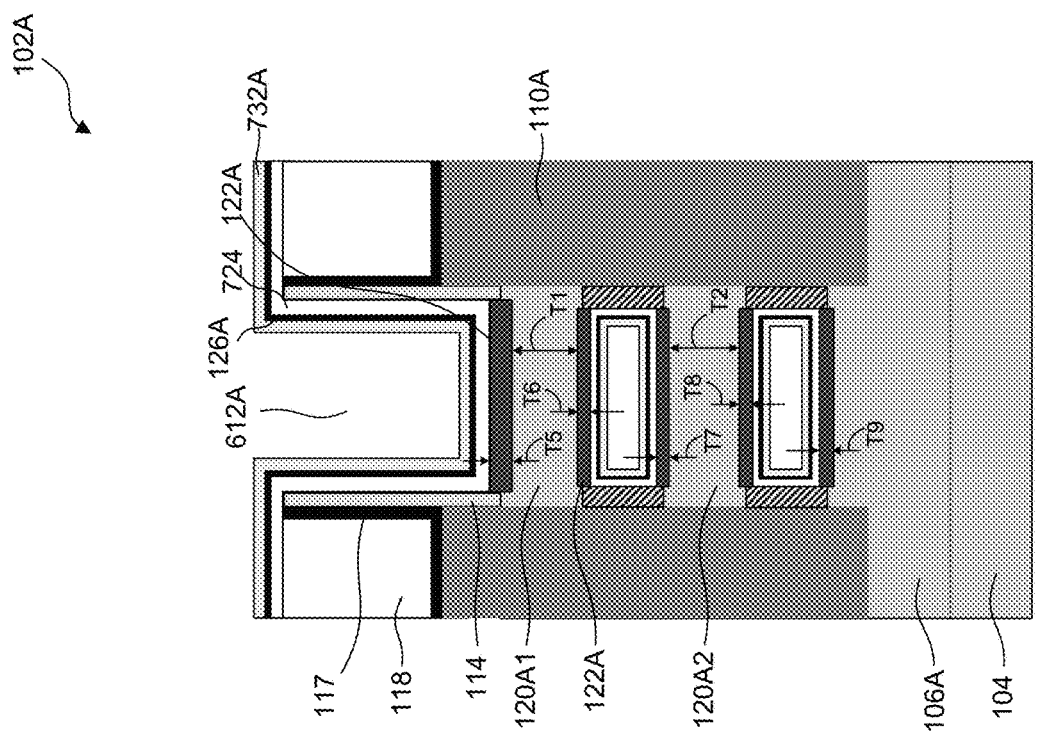
Fig. 8B
Fig. 8A

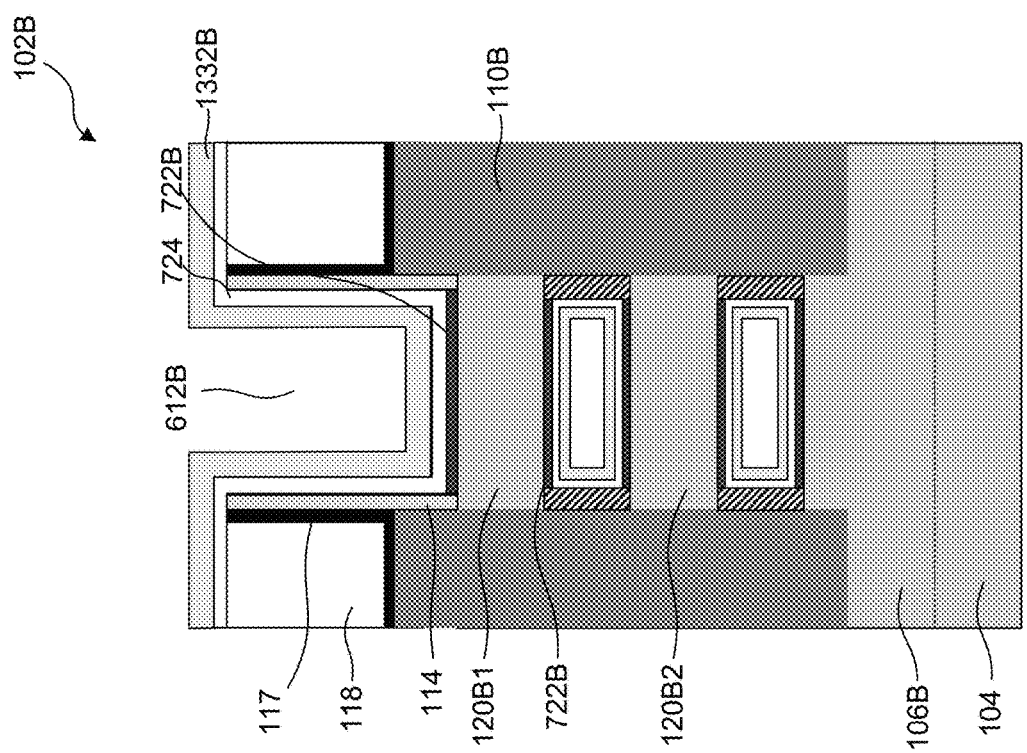
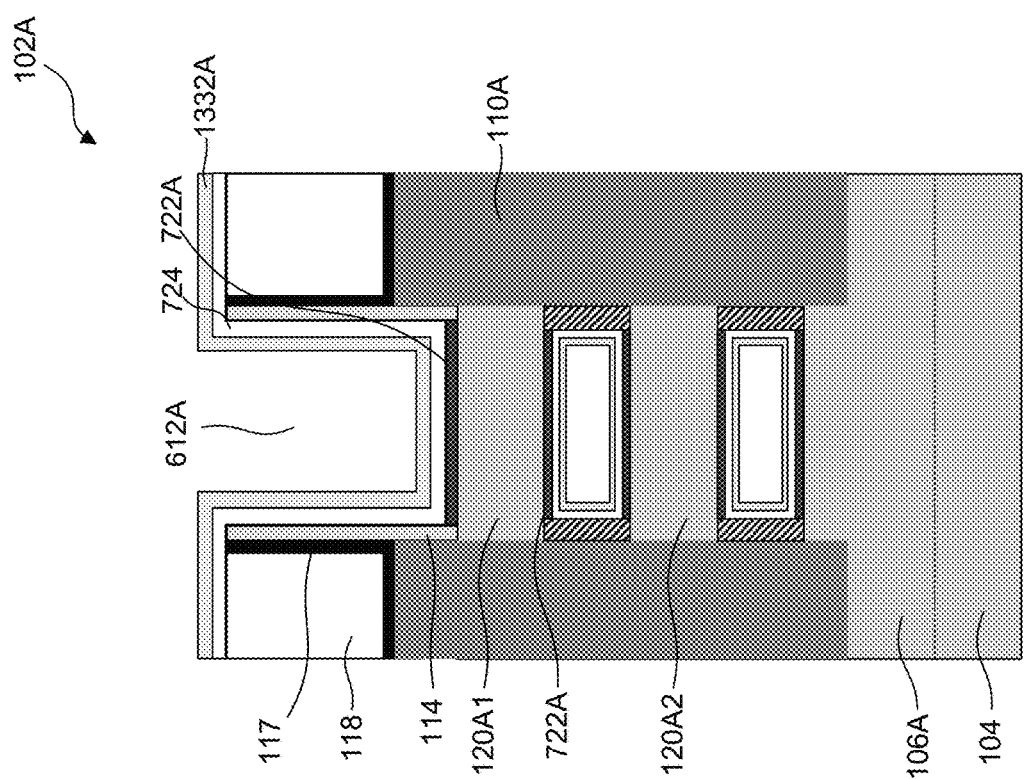

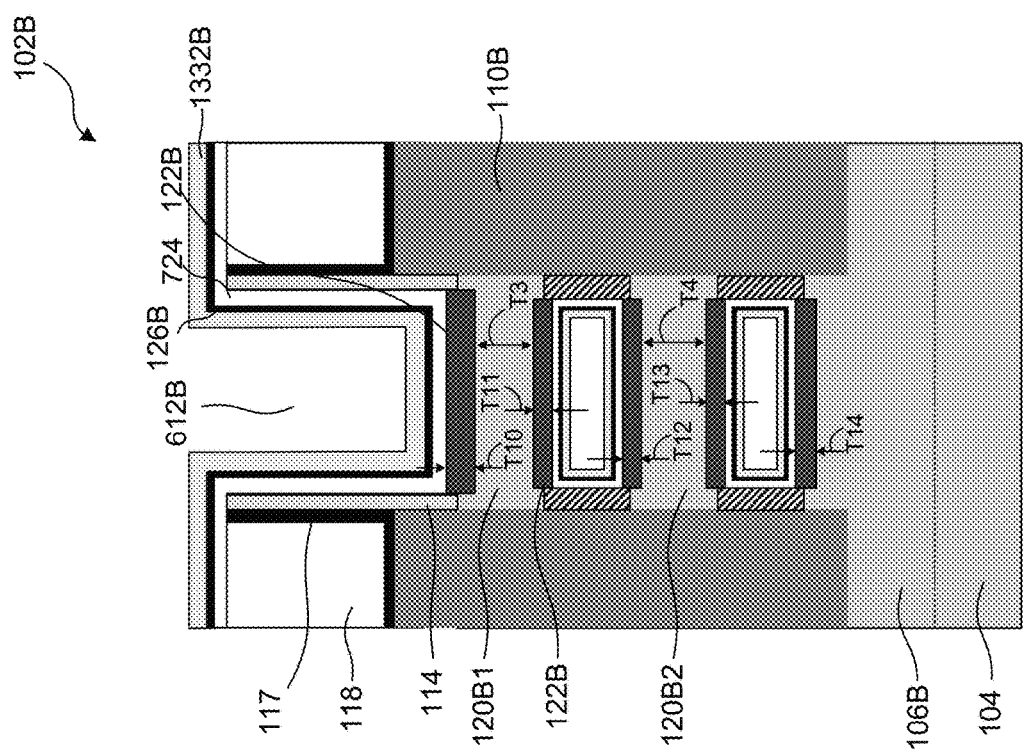
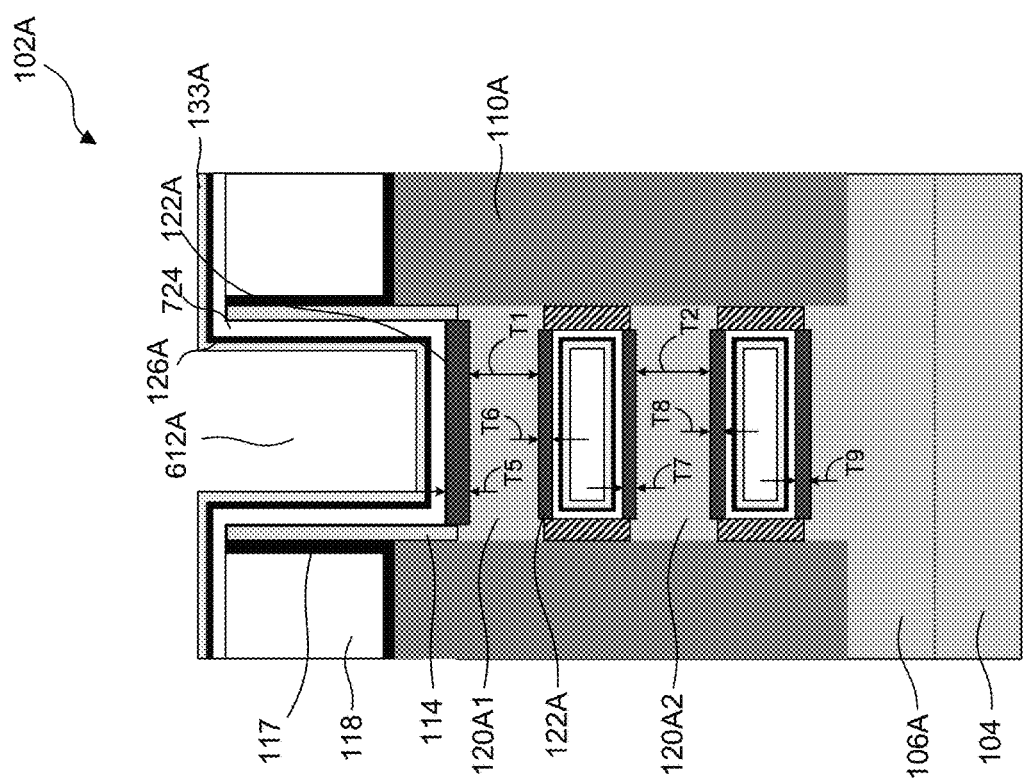
Fig. 14B
Fig. 14A

PLURAL GATE OXIDE STRUCTURES WITH DIFFERENT THICKNESSES IN SEMICONDUCTOR DEVICES

CROSS-REFERENCE TO RELATED APPLICATIONS

This application is a continuation of U.S. patent application Ser. No. 17/875,751, titled "Gate Oxide Structures in Semiconductor Devices," filed Jul. 28, 2022, which is a continuation of U.S. patent application Ser. No. 17/197,936, titled "Gate Oxide Structures in Semiconductor Devices," filed Mar. 10, 2021, which claims the benefit of U.S. Provisional Patent Application No. 63/083,216, titled "Semiconductor Device Structure and Method," filed Sep. 25, 2020, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and gate-all-around FETs (GAA FETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 3A-5B, 6A-9E, 10A-12B, and 13A-14E illustrate cross-sectional views of a semiconductor device with different gate oxide structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
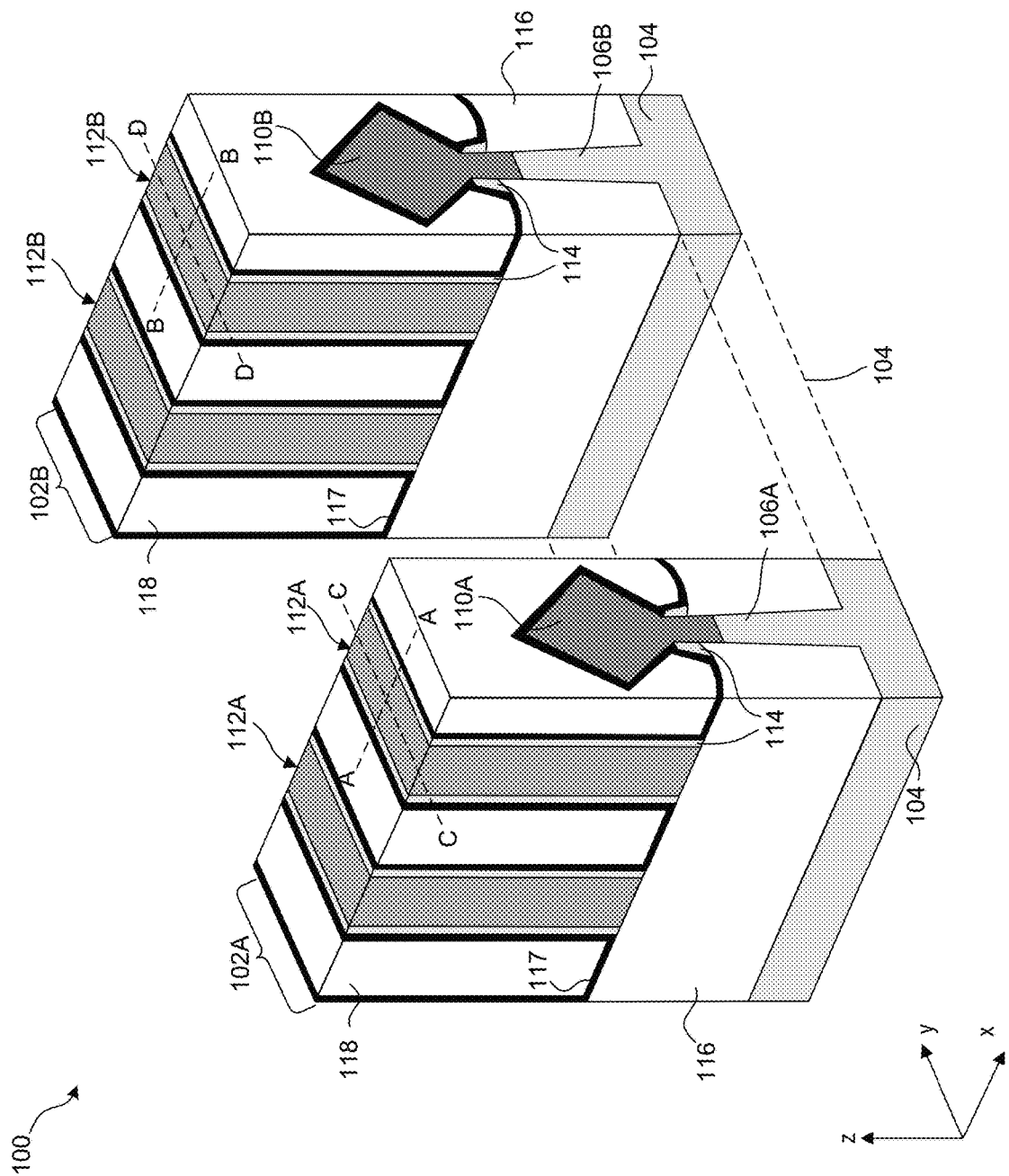
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides an example semiconductor device with FETs (e.g., finFETs, GAA FETs, or MOSFETs) having different gate structure configurations that provide different levels of power consumption. The present disclosure also provides example methods of forming such FETs on a same substrate. The example methods form FET gate structures with different gate oxide structures for forming FETs with different levels of power consumption on the same substrate. These example methods can be more cost-effective (e.g., cost reduced by about 20% to about 30%) and time-efficient (e.g., time reduced by about 15% to about 20%) in manufacturing reliable FET gate structures with low and/or ultra-low levels (e.g., in the ranges of microwatts, nanowatts, or picowatts) of power consumption than other methods of forming FETs with similar levels of power consumption on the same substrate. In addition, these example methods can form FET gate structures with smaller dimensions (e.g., smaller gate length) without increasing gate resistance than other methods of forming FETs with similar levels of power consumption.

In some embodiments, each of the FET gate oxide structures includes a high-k (HK) gate dielectric layer interposed between first and second interfacial oxide (IO) layers. The first IO layers can be formed with thicknesses different from each other to achieve different levels of power consumption in different FETs. In some embodiments, the first IO layers of different thicknesses can be formed in two oxidation processes. In the first oxidation process, the first IO layers can be formed with thicknesses substantially equal to each other. In the second oxidation process, the first IO layers can be grown to have thicknesses different from each other.

In some embodiments, the second oxidation process can include forming capping layers on the HK gate dielectric layers and performing an annealing process in an oxidizing ambient. The capping layers can be formed to have oxygen diffusivities different from each other. As used herein, the term "oxygen diffusivity" refers to the capability of a material and/or a layer to allow oxygen atoms to pass through the material and/or layer by diffusion. The capping layers can control the growth of the first IO layers during the annealing process. In some embodiments, the capping layers with different oxygen diffusivities can be formed with materials (e.g., metal nitrides, metal oxides, other suitable materials, or a combination thereof) different from each and having thicknesses substantially equal to each other or can be formed with the same material having thicknesses different form each other.

Figure 1C:
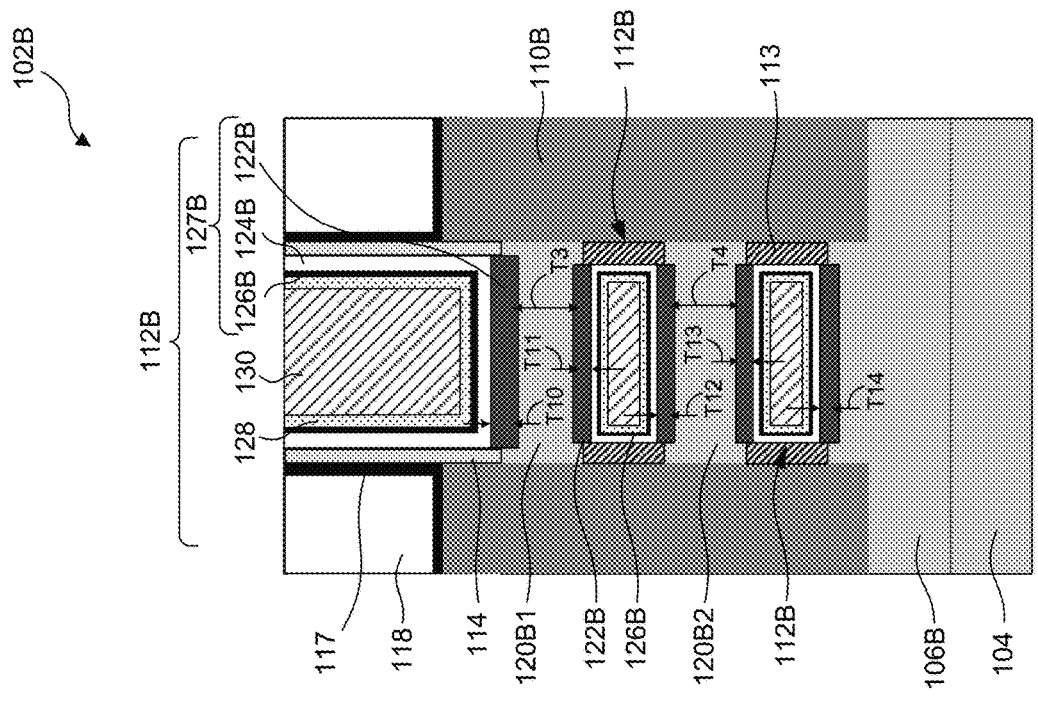
FIGS. 1B-1H illustrate cross-sectional views of a semiconductor device with different gate oxide structures, in accordance with some embodiments.
Figure 1C:
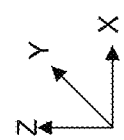
Figure 1B:
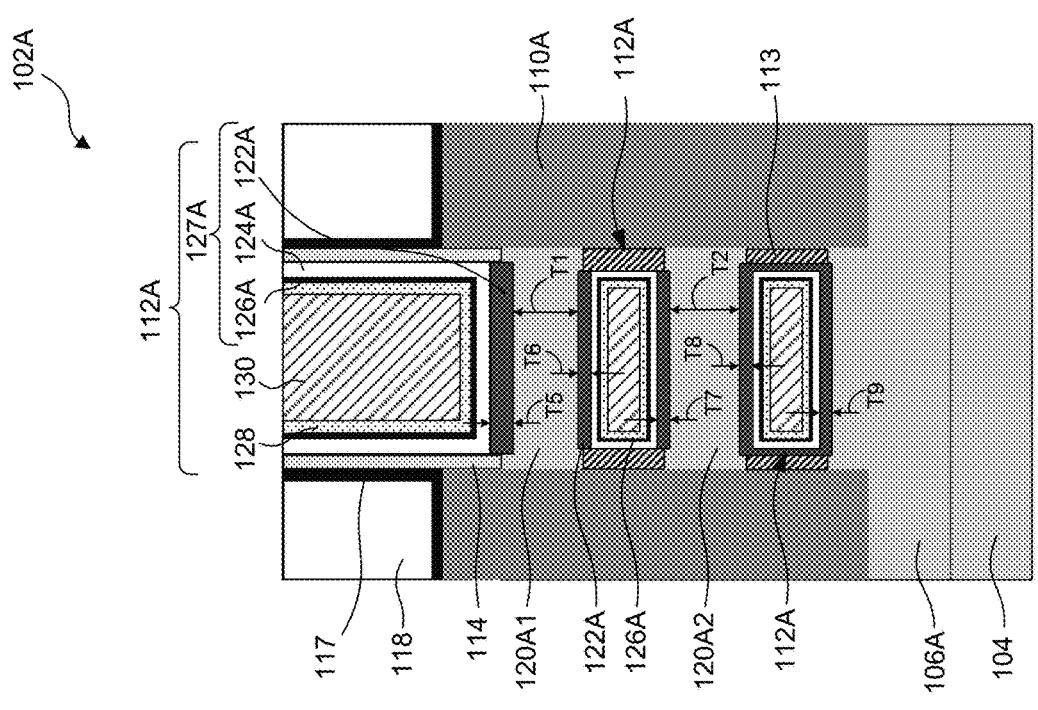
Figure 1B:
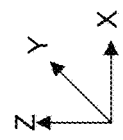
Figure 1E:
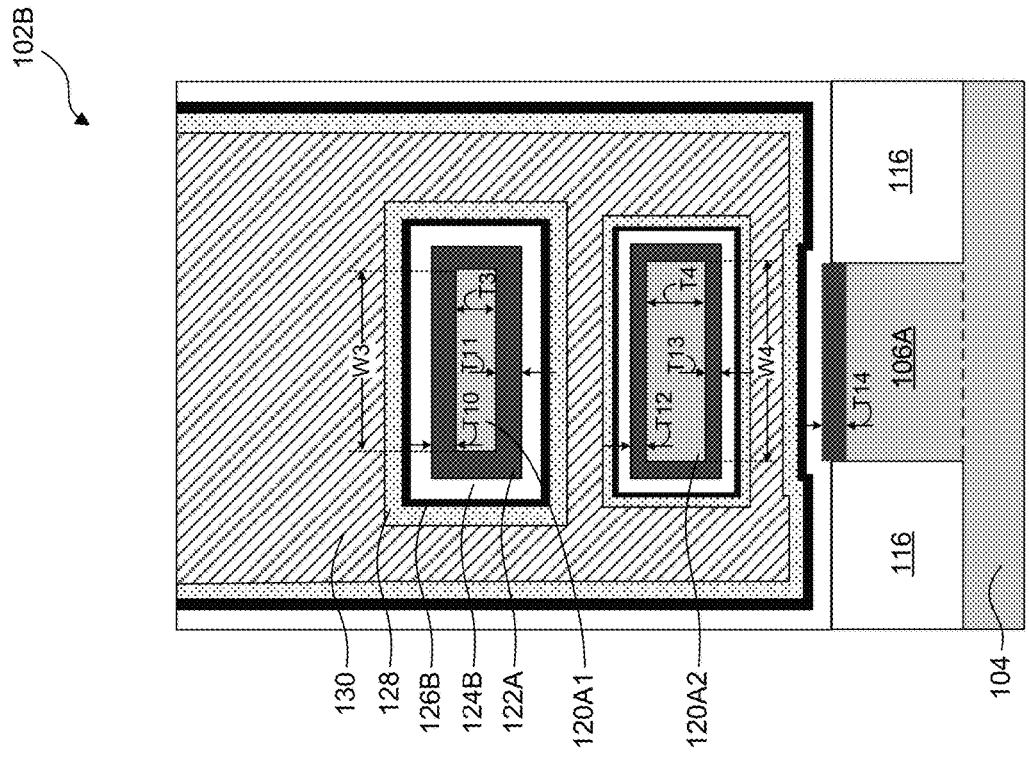
Figure 1D:
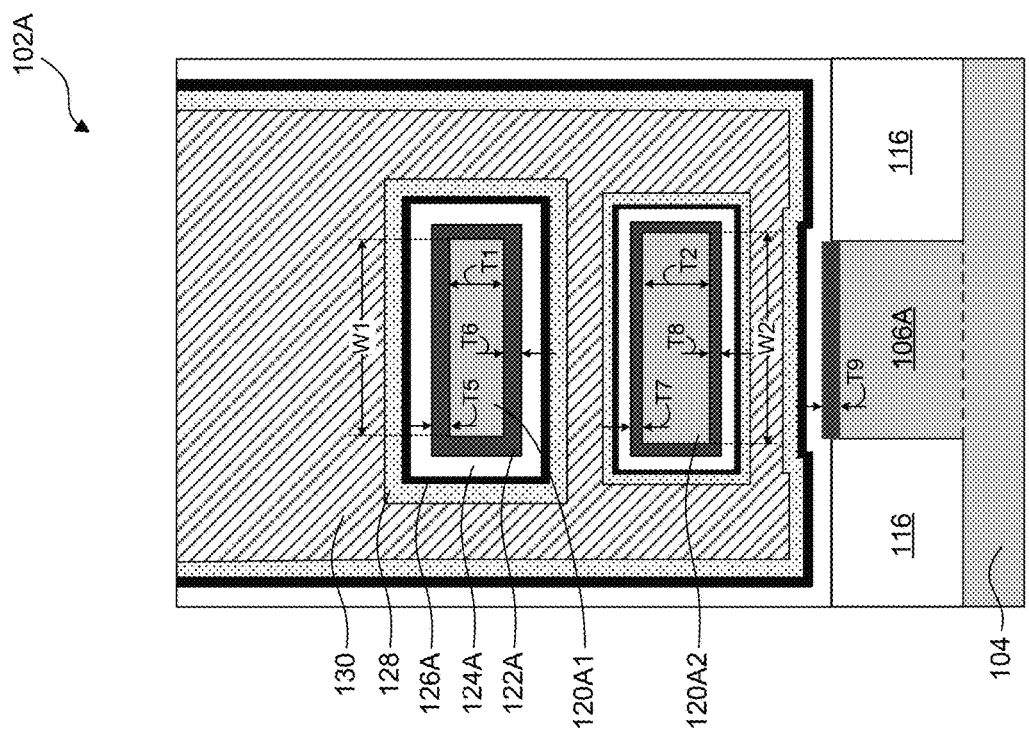

FIG. 1A illustrates an isometric view of a semiconductor device 100 with FETs 102A-102B, according to some embodiments. In some embodiments, FETs 102A-102B can represent n-type FETs 102A-102B (NFETs 102A-102B) or p-type FETs 102A-102B (PFETs 102A-102B). The discussion of FETs 102A-102B applies to both NFETs 102A-102B and PFETs 102A-102B, unless mentioned otherwise. FIGS. 1B-1C illustrate cross-sectional views of FETs 102A-102B along lines A-A and B-B of FIG. 1A. FIGS. 1D-1E illustrate cross-sectional views of FETs 102A-102B along lines C-C and D-D of FIG. 1A. FIGS. 1B-1E illustrate cross-sectional views of semiconductor device 100 with additional structures that are not shown in FIG. 1A for simplicity. The discussion of elements of FETs 102A-102B with the same annotations applies to each other, unless mentioned otherwise.

Referring to FIG. 1A, FETs 102A-102B can include an array of gate structures 112A-112B disposed on fin structures 106A-106B and an array of S/D regions 110A-110B disposed on portions of fin structures 106A-106B that are not covered by gate structures 112A-112B. FETs 102A-102B can further include gate spacers 114, shallow trench isolation (STI) regions 116, etch stop layers (ESLs) 117, and interlayer dielectric (ILD) layers 118. ILD layers 118 can be disposed on ESLs 117. In some embodiments, gate spacers 114, STI regions 116, ESLs 117, and ILD layers 118 can include an insulating material, such as silicon oxide, silicon nitride (SiN), silicon carbon nitride (SiCN), silicon oxycarbon nitride (SiOCN), silicon germanium oxide, and other suitable insulating materials.

FETs 102A-102B can be formed on a substrate 104. There may be other FETs and/or structures (e.g., isolation structures) formed on substrate 104. Substrate 104 can be a semiconductor material, such as silicon, germanium (Ge), silicon germanium (SiGe), a silicon-on-insulator (SOI) structure, other suitable semiconductor materials, and a combination thereof. Further, substrate 104 can be doped with p-type dopants (e.g., boron, indium, aluminum, or gallium) or n-type dopants (e.g., phosphorus or arsenic). In some embodiments, fin structures 106A-106B can include a material similar to substrate 104 and extend along an X-axis.

Referring to FIGS. 1B-1E, FETs 102A and 102B can include (i) stacks of nanostructured channel regions 120A1-120A2 and 120B1-120B2, disposed on fin structures 106A and 106B, (ii) gate structures 112A and 112B disposed on and wrapped around nanostructured channel regions 120A1-120A2 and 120B1-120B2, and (iii) epitaxial S/D regions 110A and 110B. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm are within the scope of the disclosure. In some embodiments, FETs 102A-102B can be finFETs and can have fin regions (not shown) instead of nanostructures channel regions 120A1-120A2 and 120B1-120B2. Such finFETs 102A-102B can have gate structures 112A-112A disposed on the fin regions.

Nanostructured channel regions 120A1-120A2 and 120B1-120B2 can include semiconductor materials similar to or different from substrate 104 and can include semiconductor material similar to or different from each other. In some embodiments, nanostructured channel regions 120A1-120A2 and 120B1-120B2 can include Si, silicon arsenic (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, or other suitable semiconductor materials. Though two nanostructured channel regions are shown in each stack, FETs 102A-102B can include any number of nanostructured channel regions in each stack. Though rectangular cross-sections of nanostructured channel regions 120A1-120A2 and 120B1-120B2 are shown, nanostructured channel regions 120A1-120A2 and 120B1-120B2 can have cross-sections of other geometric shapes (e.g., circular, elliptical, triangular, or polygonal). In some embodiments, nanostructured channel region 120A1-120A2 can have thicknesses T1-T2 and widths W1-W2 that are greater than thickness T3-T4 and widths of W3-W4 of nanostructured channel regions 120B1-120B2 due to the different configurations of gate structures 112A and 112B, which are described in detail below.

For NFETs 102A-102B, S/D regions 110A-110B can include an epitaxially-grown semiconductor material, such as Si, and n-type dopants, such as phosphorus and other suitable n-type dopants. For PFETs 102A-102B, S/D regions 110A-110B can include an epitaxially-grown semiconductor material, such as Si and SiGe, and p-type dopants, such as boron and other suitable p-type dopants.

Gate structures 112A-112B can be multi-layered structures and can surround nanostructured channel regions 120A1-120A2 and 120B1-120B2, for which gate structures 112A-112B can be referred to as "gate-all-around (GAA) structures" or "horizontal gate-all-around (HGAA) structures." FETs 102A-102B can be referred to as "GAA FETs 102A-102B." Gate portions of gate structures 112A-112B surrounding nanostructured channel regions 120A1-120A2 and 120B1-120B2 can be electrically isolated from adjacent S/D regions 110A-110B by inner spacers 113. Gate portions of gate structures 112A-112B disposed on the stacks of nanostructured channel regions 120A1-120A2 and 120B1-120B2 can be electrically isolated from adjacent S/D regions 110A-110B by gate spacers 114. Inner spacers 113 and gate spacers 114 can include an insulating material, such as $SiO_2$, SiN, SiCN, SiOCN, and other suitable insulating materials.

In some embodiments, gate lengths of gate structures 112A-112B are substantially equal to each to other. Gate structures 112A-112B can include (i) gate oxide structures 127A-127B, (ii) work function metal (WFM) layers 128 disposed on gate, and (iii) gate metal fill layers 130 disposed on WFM layers 128. In some embodiments, gate structure 112A-112B can further include glue layers (not shown) between WFM layers 128 and gate metal fill layers 130 for better adhesion of gate metal fill layers 130 to WFM layers 128. The glue layers can include titanium nitride (TiN), tantalum nitride (TaN), molybdenum nitride (MoN), tungsten nitride (WN), or other suitable metal nitrides. Though FIGS. 1B-1E show that all the layers of gate structures 112A-112B are wrapped around nanostructured channel regions 120A1-120A2 and 120B1-120B2, nanostructured channel regions 120A1-120A2 and 120B1-120B2 can be wrapped around by at least gate oxide structures 127A-127B. Accordingly, nanostructured channel regions 120A1-120A2 and 120B1-120B2 can be electrically isolated from each other to prevent shorting between gate structures 112A-112B and S/D regions 110A-110B during operation of FETs 102A-102B.

For NFETs 102A-102B, WFM layers 128 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based conductive materials, or a combination thereof. For PFETs 102A-102B, WFM layers 128 can include substantially Al-free (e.g., with no Al) conductive materials, such as titanium nitride (TiN), titanium carbon nitride (TiCN), titanium silicon nitride (TiSiN), titanium gold (Ti—Au) alloy, titanium copper (Ti—Cu) alloy, tantalum nitride (TaN), tantalum carbon nitride (TaCN), tantalum silicon nitride (TaSiN), tantalum gold (Ta—Au) alloy, tantalum copper (Ta—Cu), tungsten nitride (WN), tungsten carbon nitride (WCN), other suitable substantially Al-free conductive materials, and a combination thereof.

In some embodiments, gate metal fill layers 130 can include conductive materials with low resistivity (e.g., resistivity about 50 μΩ-cm, about 40 μΩ-cm, about 30 μΩ-cm, about 20 μΩ-cm, or about 10 μΩ-cm), such as cobalt (Co), tungsten (W), ruthenium (Ru), iridium (Ir), copper (Cu), molybdenum (Mo), other suitable conductive materials with low resistivity, and a combination thereof.

Gate oxide structure 127A-127B can include first interfacial oxide (IO) layers 122A-122B, HK gate dielectric layers 124A-124B disposed on respective first IO layers 122A-122B, and second IO layers 126A-126B disposed on respective HK gate dielectric layers 124A-124B. Since the level of power consumption by a FET is inversely proportional to the thickness of the first IO layers, first IO layers 122B can be formed with thicknesses T10-T14 that are greater than respective thicknesses T5-T9 of first IO layers 122A to form FET 102B with a lower level of power consumption than that of FET 102A. In some embodiments, thicknesses of HK gate dielectric layers 124A-124B can be similar to or different from each other and thicknesses of second IO layers 126A-126B can be similar to or different from each other.

First IO layers 122A can be formed by oxidizing the surfaces of nanostructured channel regions 120A1-120A2, as described in detail below. Due to the different oxidation rates of the surfaces of nanostructured channel regions 120A1-120A2 along a Z-axis during the formation of first IO layers 122A, first IO layers 122A can be formed with thicknesses T5-T9 different from each other. The different oxidation rates also results in different thicknesses of surface portions of nanostructured channel regions 120A1-120A2 being consumed during the formation of IO layers 122A. As a result, thicknesses T1-T2 of nanostructured channel regions 120A1-120A2 can be different from each other and widths W1-W2 of nanostructured channel regions 120A1-120A2 can be different from each other. In some embodiments, the oxidation rates can decrease gradually along a negative Z-axis direction and as a result, thickness T1 can be smaller than thickness T2, width W1 can be smaller than width W2, and thickness T5 can be greater than thickness T6, which can be greater than thickness T7, which can be greater than thickness T8, which can be greater thickness T9.

Similarly, first IO layers 122B can be formed by oxidizing the surfaces of nanostructured channel regions 120B1-120B2 and thicknesses T3-T4, widths W3-W4, and thicknesses T10-T14 can be different from each other due to the different oxidation rates of the surfaces of nanostructured channel regions 120B1-120B2 along a Z-axis during the formation of first IO layers 122B. In some embodiments, the oxidation rates can decrease gradually along a negative Z-axis direction and as a result, thickness T3 can be smaller than thickness T4, width W3 can be smaller than width W4, and thickness T10 can be greater than thickness T11, which can be greater than thickness T12, which can be greater than thickness T13, which can be greater thickness T14. Due to the differences in thicknesses between first IO layers 122A and 122B, thicknesses T1-T2 of nanostructured channel region 120A1-120A2 can be greater than respective thickness T3-T4 of nanostructured channel regions 120B1-120B2. For similar reasons, widths W1-W2 of nanostructured channel region 120A1-120A2 can be greater than respective widths W3-W4 of nanostructured channel regions 120B1-120B2.

First IO layers 122A can include an oxide of the semiconductor material in nanostructured channel regions 120A1-120A2 and first IO layers 122B can include an oxide of the semiconductor material included in nanostructured channel regions 120B1-120B2. In some embodiments, each of first IO layers 122A-122B can include a material similar to each other if nanostructured channel regions 120A1-120A2 and 120B1-120B2 have the same semiconductor material or different from each other if nanostructured channel regions 120A1-120A2 and 120B1-120B2 have semiconductor materials different from each other. In some embodiments, first IO layers 122A-122B can include silicon oxide ($SiO_x$), silicon germanium oxide ($SiGeO_x$), or other suitable oxides of semiconductor materials.

In some embodiments, HK gate dielectric layers 124A-124B can include (i) a HK dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (ii) a HK dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) a combination thereof, or (iv) other suitable HK dielectric materials. As used herein, the term "high-k (HK)" refers to a high dielectric constant. In the field of semiconductor device structures and manufacturing processes, HK refers to a dielectric constant that is greater than the dielectric constant of $SiO_2$ (e.g., greater than 3.9).

In some embodiments, each of HK gate dielectric layers 124A-124B can include a single HK layer, as shown in FIGS. 1B-1E, or a stack of two HK layers with different HK materials (not shown) and different dielectric constants. In the stack of two HK layers, the first HK layer can include HfO with dopants of lanthanum (La), magnesium (Mg), rare earth metals, or other suitable dopants and the second HK layer disposed on the first HK layer can include ZrO or other suitable metal oxides, which has a higher dielectric constant that of the first HK layer. In some embodiments, the dopants in the first HK layer can form dipoles with the oxygen atoms of $ZrO_2$ or other suitable metal oxides of the second HK layer. The dipoles can be used to tune the threshold voltages of FETs 102A-102B. Since the concentration of the dopants in the first HK layer is directly proportional to the concentration of the dipoles, and the concentration of the dipoles is directly proportional to the threshold voltage, the concentration of the dopants can be controlled to tune the concentration of the dipoles, and as a result the threshold voltages of FETs 102A-102B can be tuned. In some embodiments, the metal oxide of the second HK layer can be crystallized through an annealing process to reduce leakage through gate structures 112A-112E.

Second IO layers 126A-126B can be formed as a result of oxidation of capping layers 732A-732B (not shown in FIGS. 1B-1E; shown in FIGS. 7A-8B and 13A-14B) used during the formation of first IO layers 122A-122B and also as a result of interfacial reactions between capping layers 732A-732B and HK gate dielectric layers 124A-124B, as described in detail below. In some embodiments, in addition to capping layers 732A-732B, second IO layers 126A-126B can control the growth of first IO layers 122A-122B by controlling the diffusion rate of oxygen atoms through second IO layers 126A-126B. To achieve thicker first IO layers 122B than first IO layers 122A, second IO layer 126B can include a material with an oxygen diffusivity that is higher than an oxygen diffusivity of a material included in second IO layer 126A. As oxygen diffusivity of a material is directly proportional to the Gibbs energy of the material, second IO layer 126B can be formed to include a material that has a Gibbs energy that is higher than a Gibbs energy of the material included in second IO layer 126A.

In some embodiments, second IO layers 126A-126B can include titanium silicon hafnium oxynitride (TiSiHfON), titanium hafnium oxynitride (TiHfON), tantalum hafnium oxynitride (TaHfON), aluminum hafnium oxynitride (AlHfON), tungsten hafnium oxynitride (WHfON), or other suitable metal hafnium oxynitrides when second IO layers 126A-126B are formed on HK gate dielectric layers 124A-124B having a single layer of $HfO_2$. In some embodiments, second IO layers 126A-126B can include titanium silicon zirconium oxynitride (TiSiZrON), titanium zirconium oxynitride (TiZrON), tantalum zirconium oxynitride (TaZrON), aluminum zirconium oxynitride (AlZrON), tungsten zirconium oxynitride (WZrON), or other suitable metal zirconium oxynitrides when second IO layers 126A-126B are formed on HK gate dielectric layers 124A-124B having a single layer of ZrO or the stack of two layers with HfO and $ZrO_2$. In some embodiments, second IO layers 126A-126B can include the same material when the growth of first IO layers 122A-122B are controlled by different thicknesses of capping layers 1332A-1332E, as described below with reference to FIGS. 13A-14B.

Though semiconductor device 100 is shown to have two FETs 102A-102B, semiconductor 100 can have two or more FETs with different configurations of gate oxide structures to have FETs with different levels of power consumption. In some embodiments, in addition to FETs 102A-102B, semiconductor device 100 can include FETs 102C-102E (not shown in FIG. 1A for simplicity) disposed on substrate 104. Similar to FIGS. 1B-1C, FIGS. 1F-1H illustrate cross-sectional views of FETs 102C-102E along an X-axis. The discussion of elements of FETs 102A-102E with the same annotations applies to each other, unless mentioned otherwise.

FETs 102C, 102D, and 102E can include (i) stacks of nanostructured channel regions 120C1-120C2, 120D1-120D2, and 120E1-120E2, disposed on fin structures 106C, 106D, and 106E, (ii) gate structures 112C, 112D, and 112E disposed on and wrapped around nanostructured channel regions 120C1-120C2, 120D1-120D2, and 120E1-120E2, and (iii) epitaxial S/D regions 110C, 110D, and 110E. The discussion of fin structures 106A-106B, nanostructured channel regions 120A1-120A2 and 120B1-120B2, S/D regions 110A-110B, and gate structures 112A-112B applies to fin structures 106C-106E, nanostructured channel regions 120C1-120C2, 120D1-120D2, and 120E1-120E2, S/D regions 110C-110E, and gate structures 112C-112E, unless mentioned otherwise.

Gate oxide structure 127C-127E can include first IO layers 122C-122E, HK gate dielectric layers 124C-124E disposed on respective first IO layers 122C-122E, and second IO layers 126C-126E disposed on respective HK gate dielectric layers 124C-124E. The discussion of HK gate dielectric layers 124A-124B applies to HK gate dielectric layers 124C-124E, unless mentioned otherwise. First IO layers 122E can be formed with thicknesses T25-T29 that are greater than respective thicknesses T20-T24 of first IO layers 122D by about 0.1 nm to about 1 nm, which can be greater than respective thicknesses T15-T19 of first IO layers 122C by about 0.1 nm to about 1 nm, which can be greater than respective thicknesses T10-T14 of first IO layers 122B by about 0.1 nm to about 1 nm, which can be greater than respective thicknesses T5-T9 of first IO layers 122A by about 0.1 nm to about 1 nm. As a result, FET 102E has a lower level of power consumption than that of FET 102D, which has a lower level of power consumption than that of FET 102C, which has a lower level of power consumption than that of FET 102B, which has a lower level of power consumption than that of FET 102A, since the level of power consumption by a FET is inversely proportional to the thickness of the first IO layers. If the relative thickness of first IO layers 122A-122E is below about 0.1 nm, there may not be adequate difference between the levels of power consumption between FETs 102A-102E. On the other hand, if the relative thickness of first IO layers 122A-122E is above about 1 nm, the device size increases, and consequently, increases device manufacturing cost. In some embodiments, first IO layers 122A-122E can have thicknesses ranging from about 1 nm to about 5 nm. Other suitable dimensions of first IO layers 122A-122E are within the scope of the present disclosure.

Second IO layers 126C-126E can be formed as a result of oxidation of capping layers 732C-732E (not shown in FIGS. 1F-1H; shown in FIGS. 7C-8E and 13C-14E) used during the formation of first IO layers 122C-122E and also as a result of interfacial reactions between capping layers 732C-732E and HK gate dielectric layers 124C-124E, as described in detail below. In some embodiments, to achieve the relative thicknesses of first IO layers 122A-122E by controlling the diffusion of oxygen atoms through second IO layers 126A-126C, second IO layers 126A, 126B, 126C, 126D, and 126E can include TiSiHfON, TiHfON, TaHfON, AlHfON, and WHfON, respectively, when second IO layers 126A-126E are formed on HK gate dielectric layers 124A-124E having a single layer of $HfO_2$. In some embodiments, second IO layers 126A, 126B, 126C, 126D, and 126E can include TiSiZrON, TiZrON, TaZrON, AlZrON, and WZrON, respectively, when second IO layers 126A-126E are formed on HK gate dielectric layers 124A-124E having a single layer of $ZrO_2$ or the stack of two layers with $HfO_2$ and $ZrO_2$. The oxygen diffusivity and Gibbs energy of WHfON and WZrON can be higher than that of AlHfON and AlZrON, respectively. The oxygen diffusivity and Gibbs energy of AlHfON and AlZrON can be higher than that of TaHfON and TaZrON, respectively. The oxygen diffusivity and Gibbs energy of TaHfON and TaZrON can be higher than that of TiHfON and TiZrON, respectively. The oxygen diffusivity and Gibbs energy of TiHfON and TiZrON can be higher than that of TiSiHfON and TiSiZrON, respectively. In some embodiments, second IO layers 126A-126E can include the same material when the growth of first IO layers 122A-122E are controlled by different thicknesses of capping layers 1332A-1332E, as described below with reference to FIGS. 13A-14B. In some embodiments, second IO layers 126A-126E can have thicknesses ranging from about 0.1 nm to about 1 nm. Other suitable dimensions of second IO layers 126A-126E are within the scope of the present disclosure.

Figure 1G:
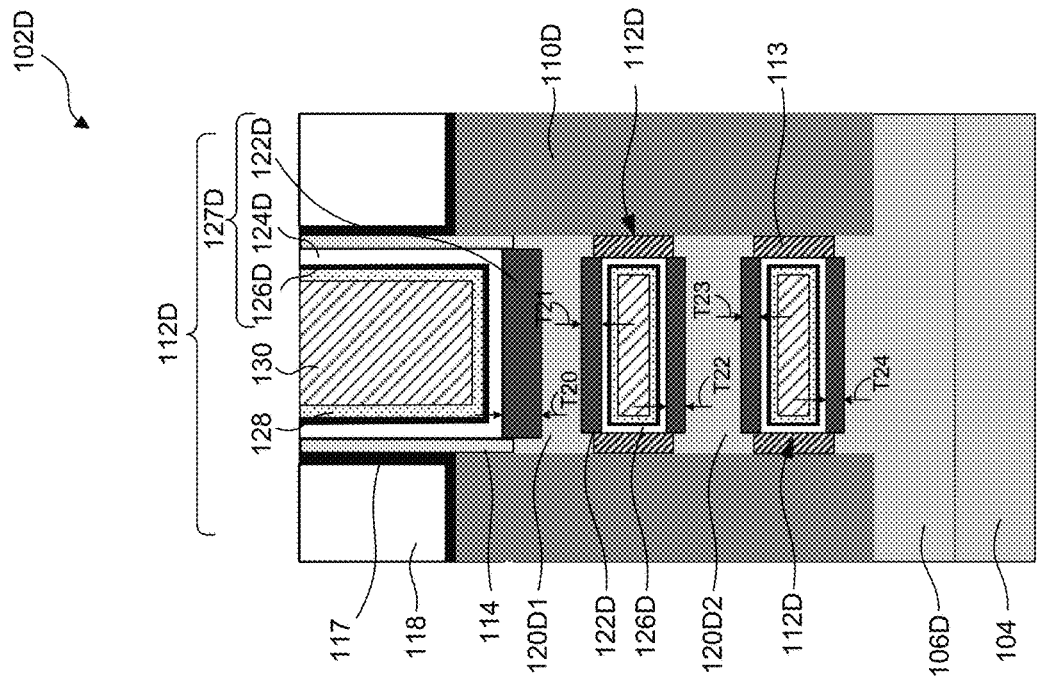
Figure 1F:
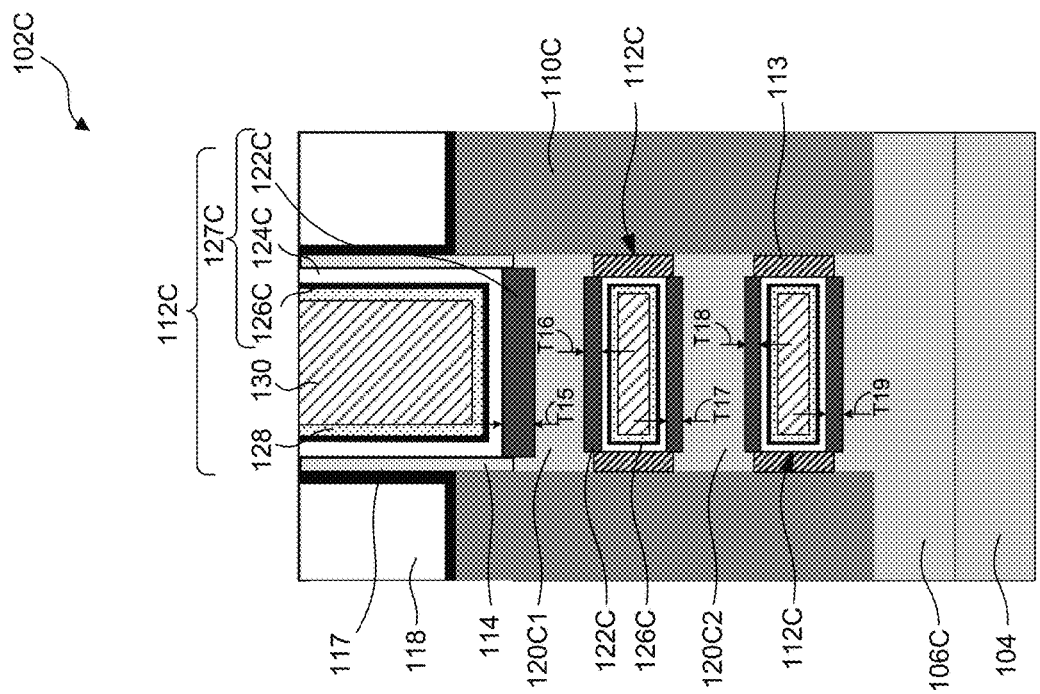
Figure 2:
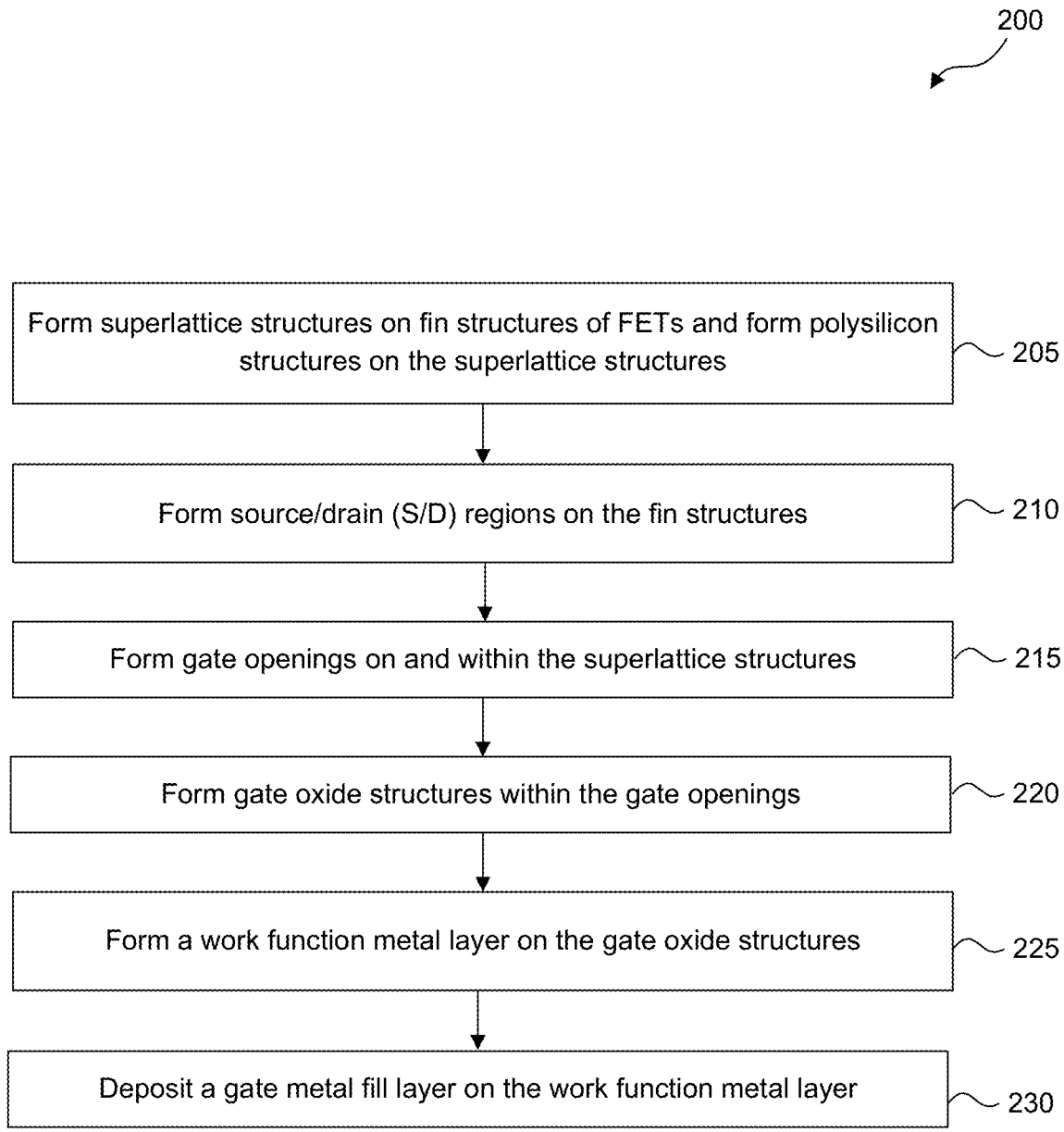
FIG. 2 is a flow diagram of a method for fabricating a semiconductor device with different gate oxide structures, in accordance with some embodiments.

FIG. 2 is a flow diagram of an example method 200 for fabricating FETs 102A-102E of semiconductor device 100, according to some embodiments. For illustrative purposes, the operations illustrated in FIG. 2 will be described with reference to the example fabrication process for fabricating FETs 102A-102E as illustrated in FIGS. 3A-5B, 6A-9E, 10A-12B, and 13A-14E. FIGS. 3A-5B, 6A-9E, 10A-12B, and 13A-14E are cross-sectional views of FETs 102A-102E along an X-axis at various stages of fabrication, according to various embodiments. Operations can be performed in a different order or not performed depending on specific applications. It should be noted that method 200 may not produce complete FETs 102A-102E. Accordingly, it is understood that additional processes can be provided before, during, and after method 200, and that some other processes may only be briefly described herein. Elements in FIGS. 3A-5B, 6A-9E, 10A-12B, and 13A-14E with the same annotations as elements in FIGS. 1A-1H are described above.

Figures 3A, 3B:
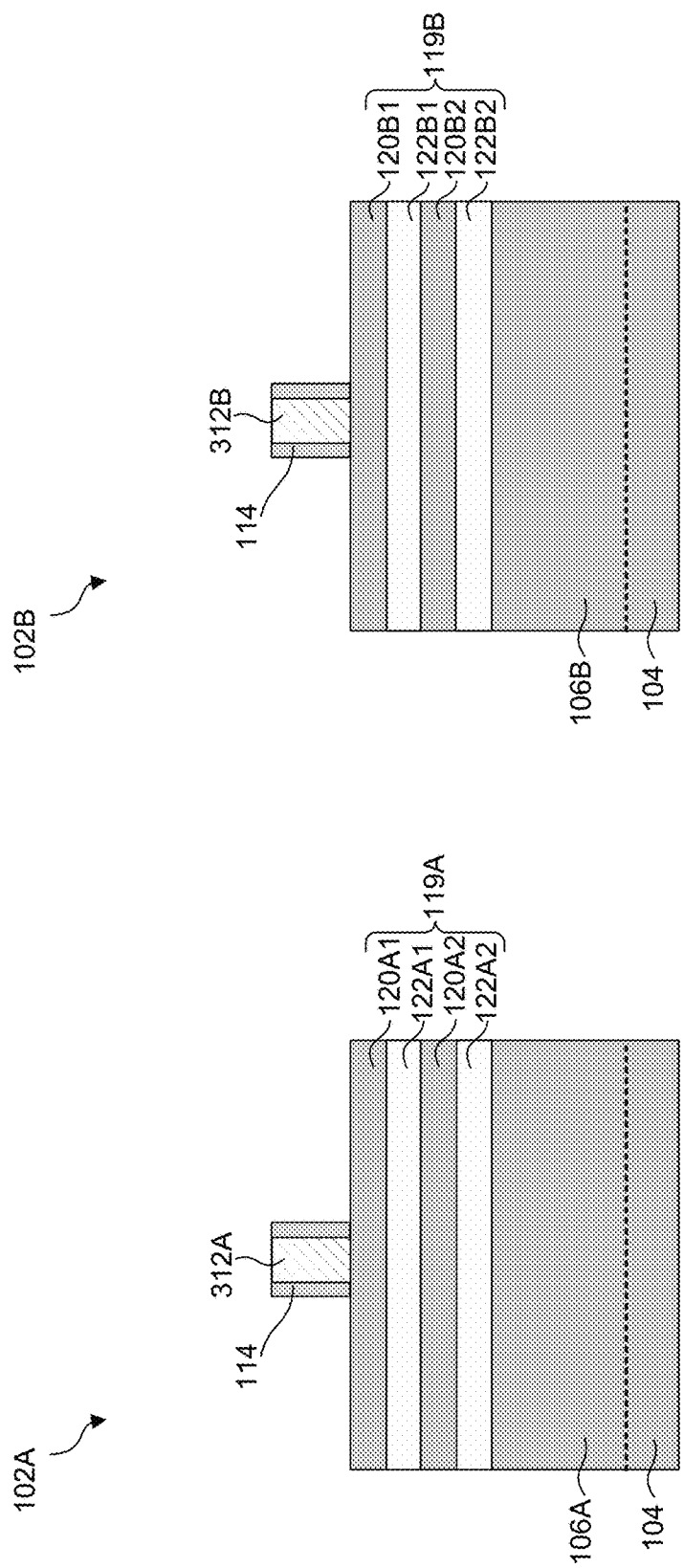

In operation 205, superlattice structures are formed on fin structures of FETs, and polysilicon structures are formed on the superlattice structures. For example, as shown in FIGS. 3A-3B, polysilicon structures 312A-312B are formed on respective superlattice structures 119A-119B, which are epitaxially formed on respective fin structures 106A-106B. Superlattice structure 119A can include nanostructured layers 120A1-120A2 and 122A1-122A2 arranged in an alternating configuration. Similarly, superlattice structure 119B can include nanostructured layers 120B1-120B2 and 122B1-122B2 arranged in an alternating configuration. In some embodiments, nanostructured layers 120A1-120A2 and 120B1-120B2 include materials similar to each other and nanostructured layers 122A1-122A2 and 122B1-122B2 include materials similar to each other. During subsequent processing, polysilicon structures 312A-213B and nanostructured layers 122A1-122A2 and 122B1-122B2 can be replaced in a gate replacement process to form gate structures 112A-112B.

Figure 4B:
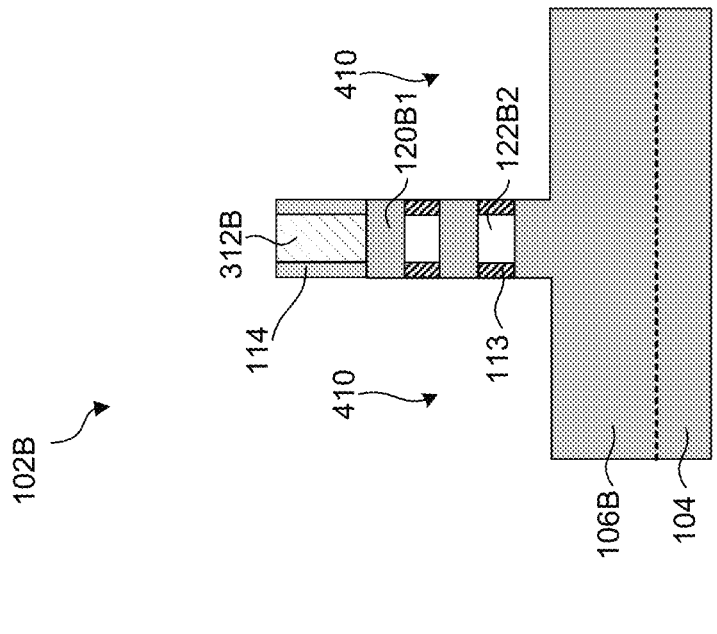
Figure 4A:
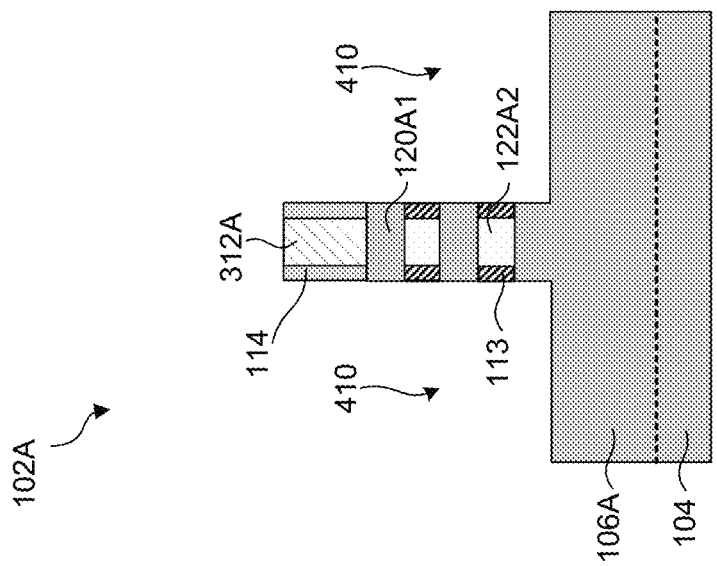
Figure 5B:
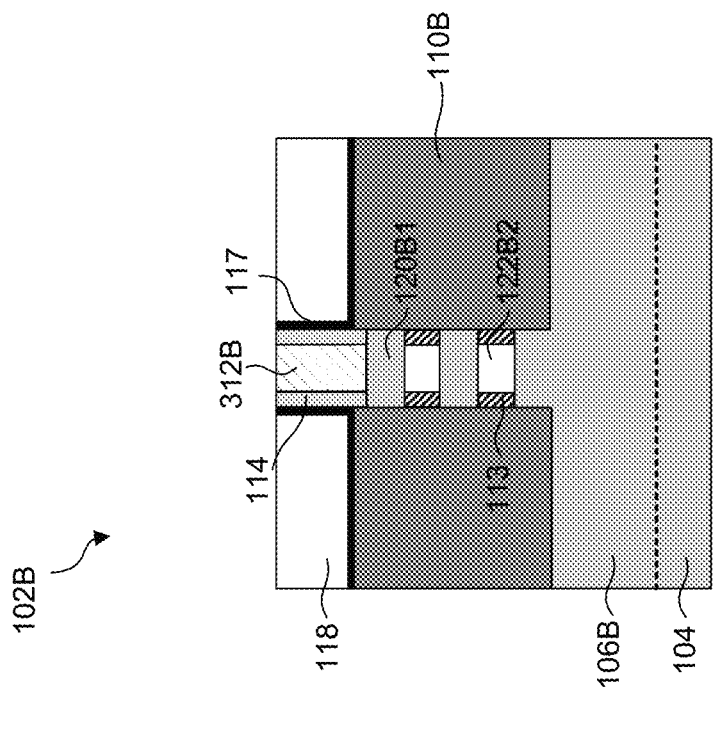
Figure 5A:
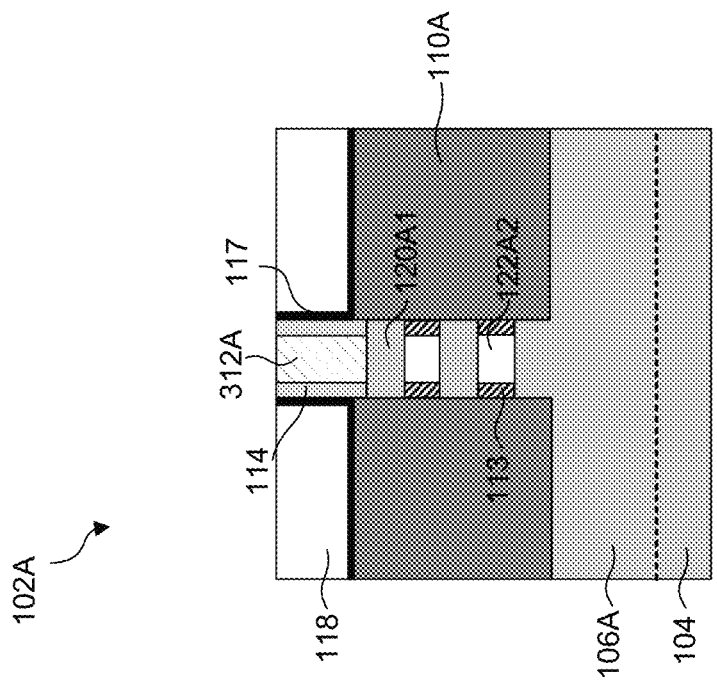

Referring to FIG. 2, in operation 210, S/D regions are formed on the fin structures. For example, as described with reference to FIGS. 4A-5B, S/D regions 110A-110B are formed on respective fin structures 106A and 106B. The formation of S/D regions 110A-110B can include sequential operations of (i) forming S/D openings 410, through superlattice structures 119A-119B, on portions of fin structures 106A-106B that are not underlying polysilicon structures 312A-312B, as shown in FIGS. 4A-4B, and (ii) epitaxially growing semiconductor materials within S/D openings 410, as shown in FIGS. 5A-5B. In some embodiments, inner spacers 113 can be formed between operations (i) and (ii) of the formation process of epitaxial S/D regions 110A-110B, as shown in FIGS. 5A-5B. Inner spacers 113 can be formed after the formation of S/D openings 410, as shown in FIGS. 5A-5B. After the formation of S/D regions 110A-110B, ESLs 117 and ILD layers 118 can be formed on S/D regions 110A-110B to form the structures of FIGS. 5A-5B. Though operations 205-210 are shown for FETs 102A-102B, similar operations can be performed to form S/D regions 110C-110E of respective FETs 102C-102E, as shown in FIGS. 6C-7E.

Figure 6A:
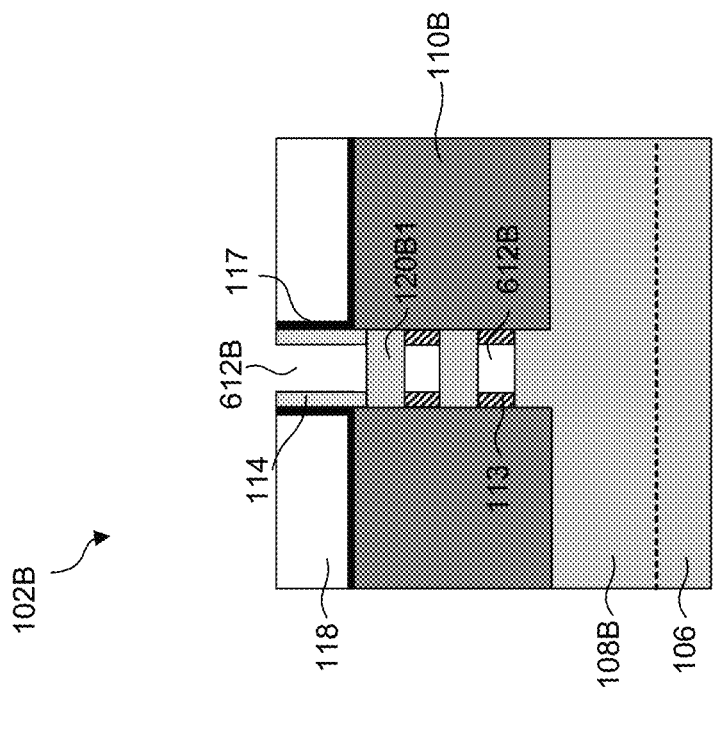
Figure 6B:
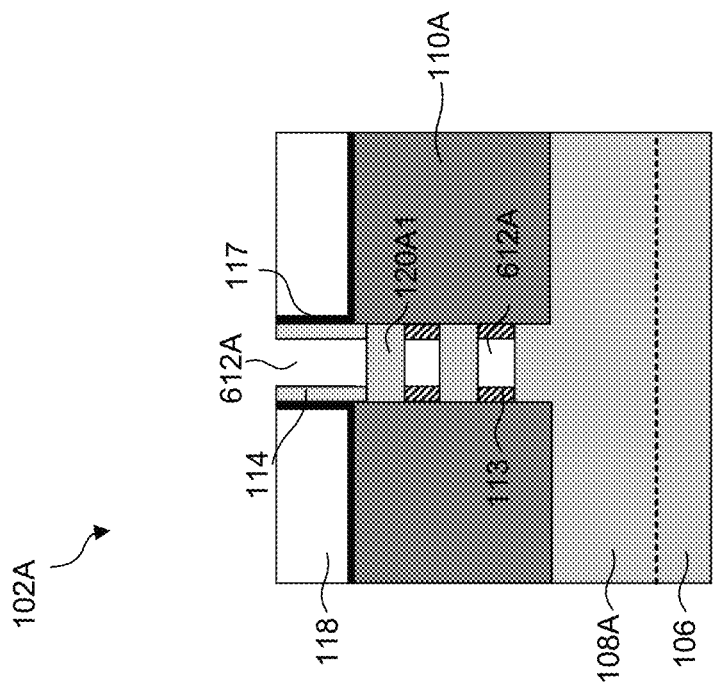
Figure 6D:
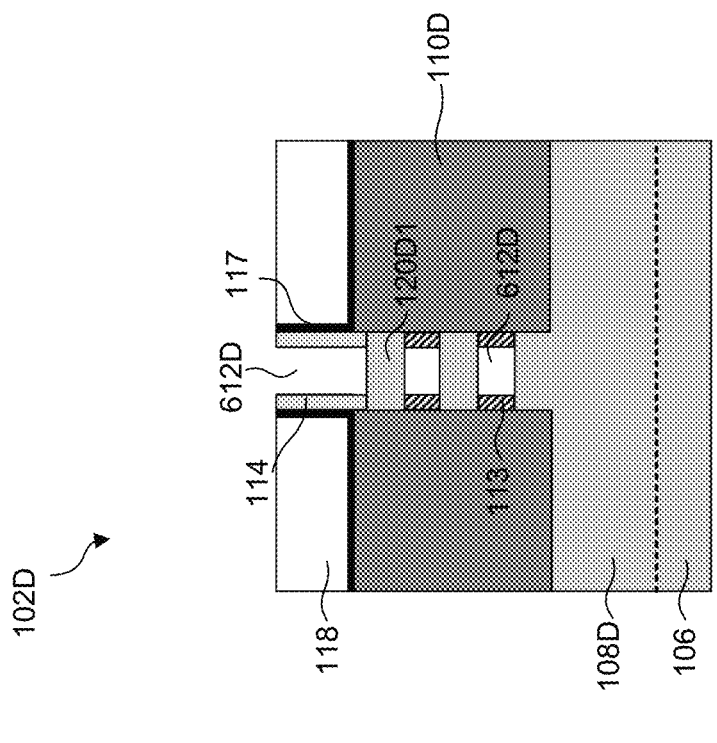
Figure 6C:
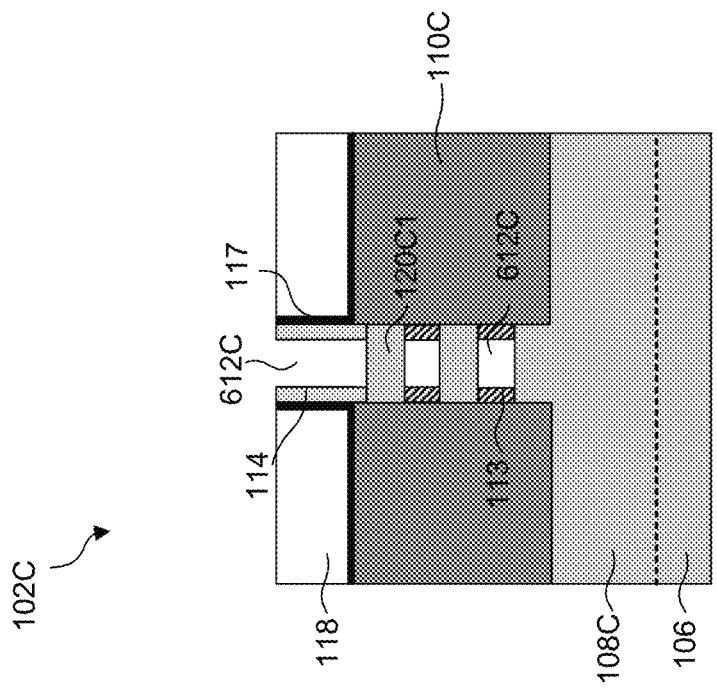
Figure 6E:
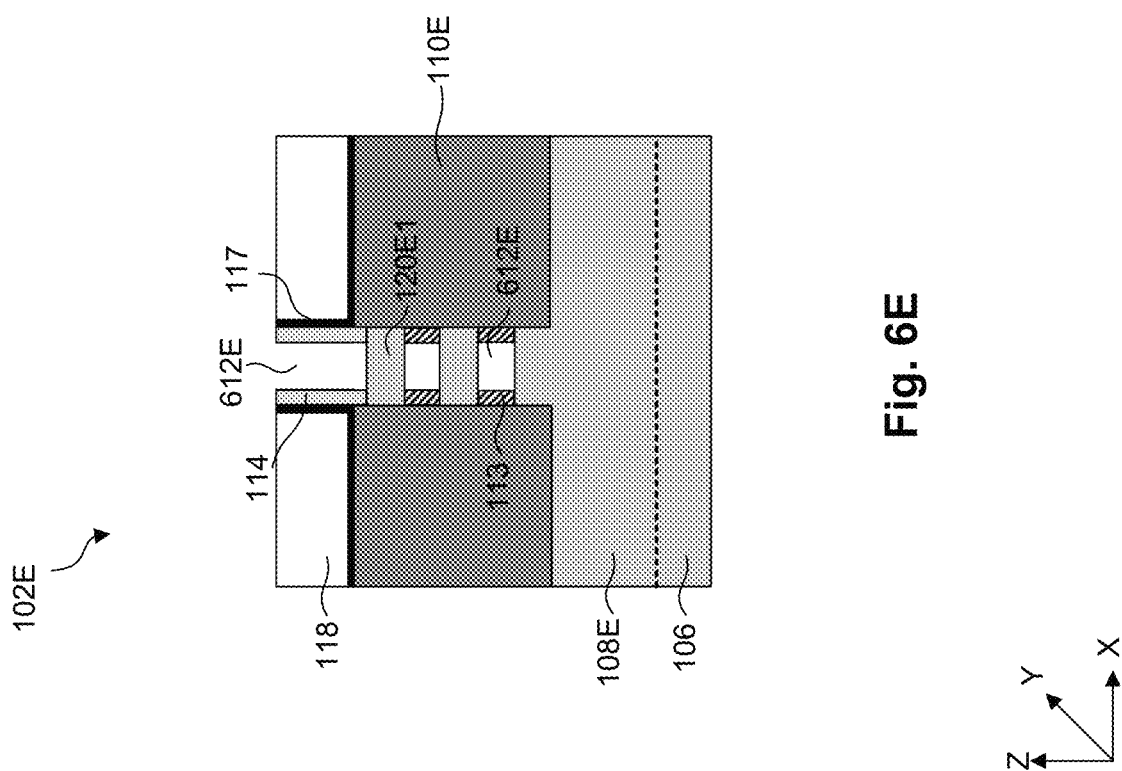
Figure 7B:
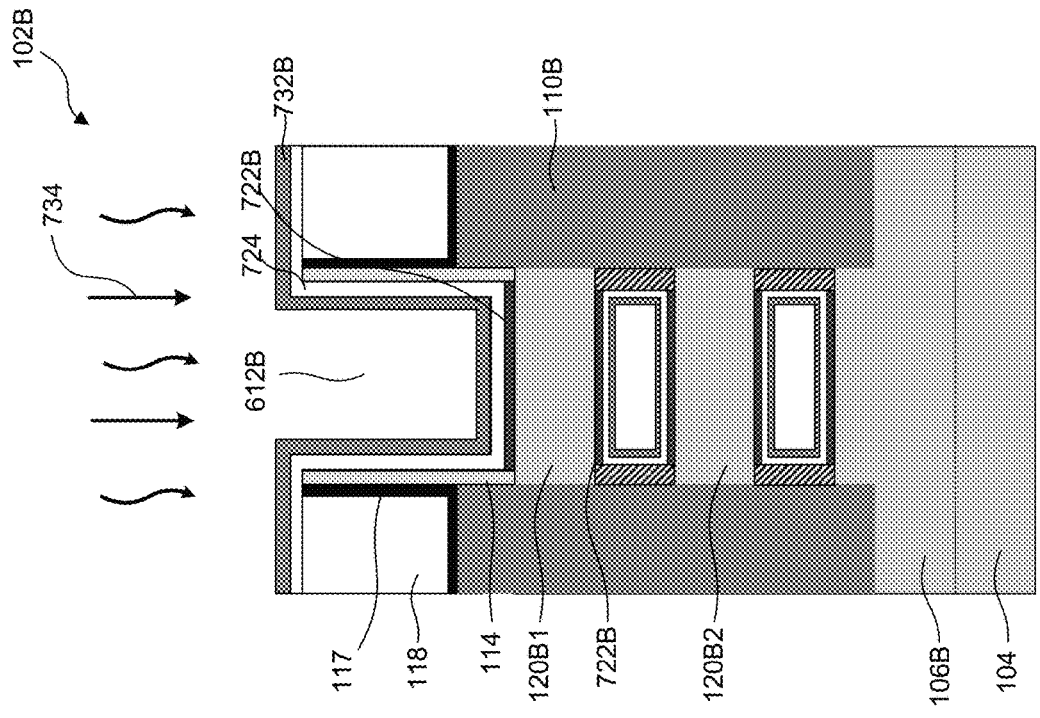
Figure 7A:
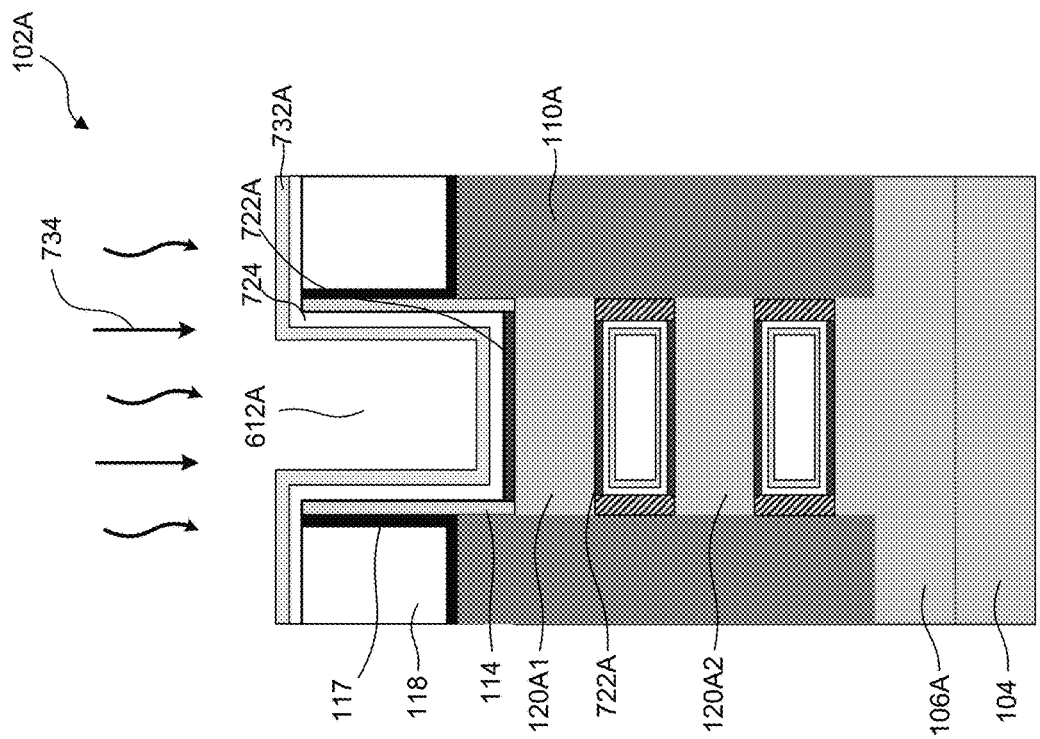
Figure 7D:
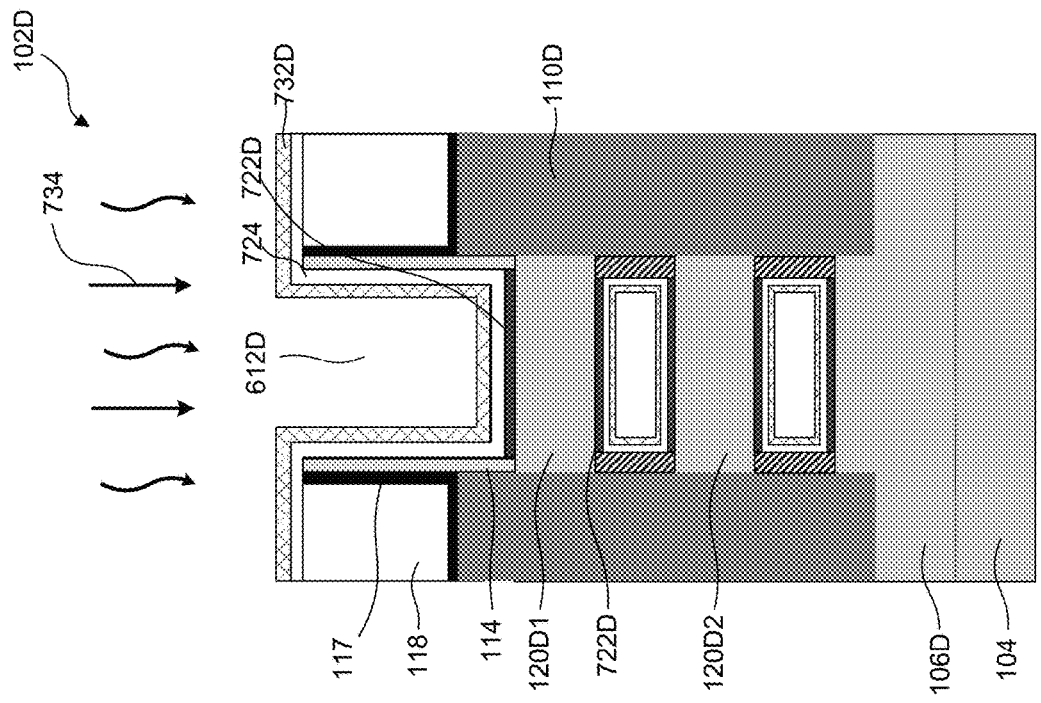
Figure 7C:
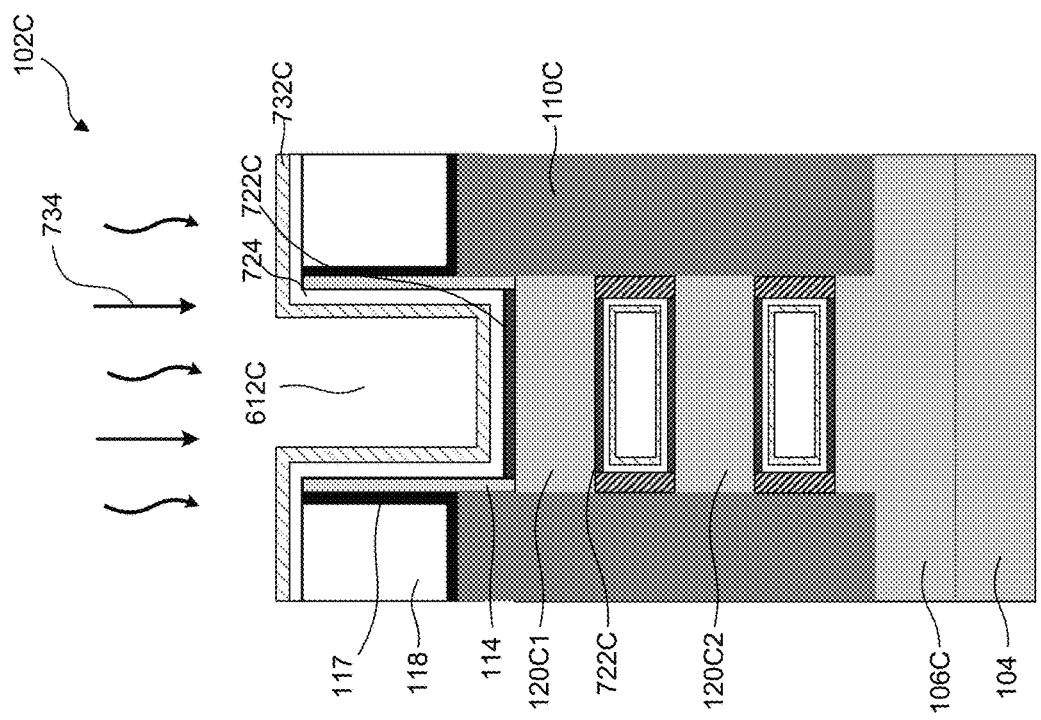
Figure 8D:
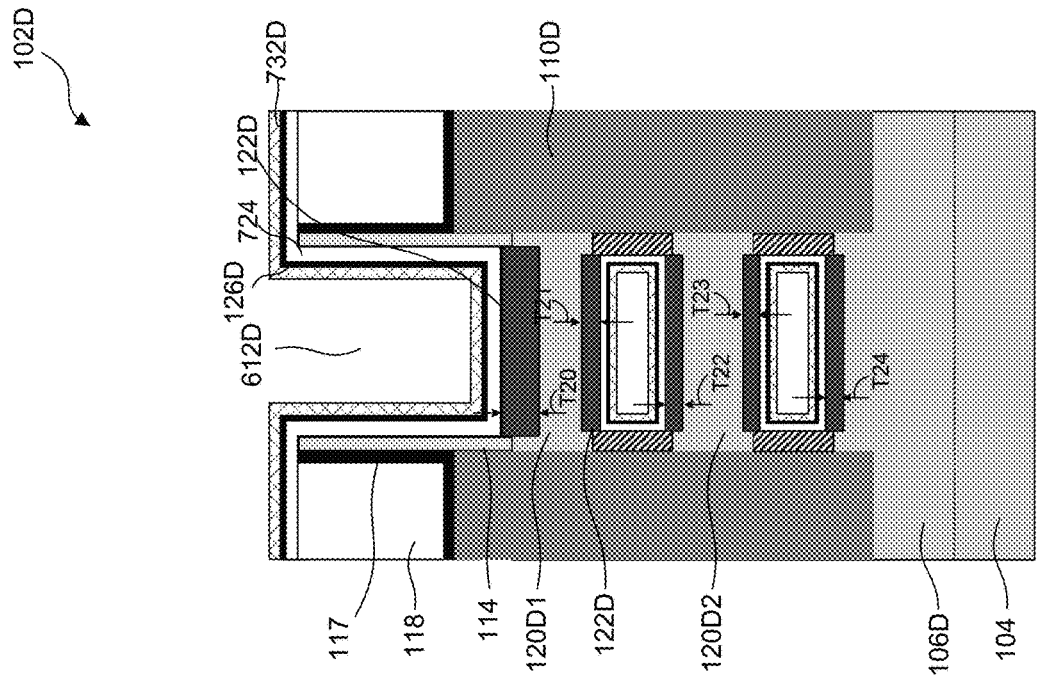
Figure 8D:
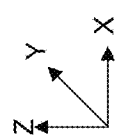
Figure 8C:
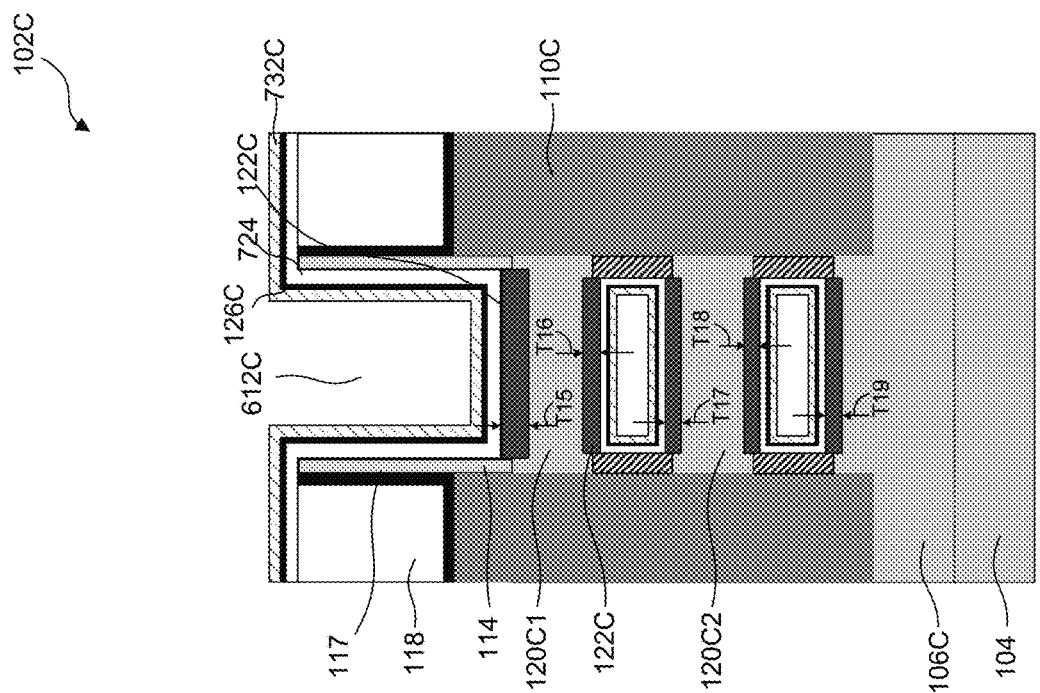
Figure 8C:
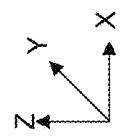
Figure 8E:
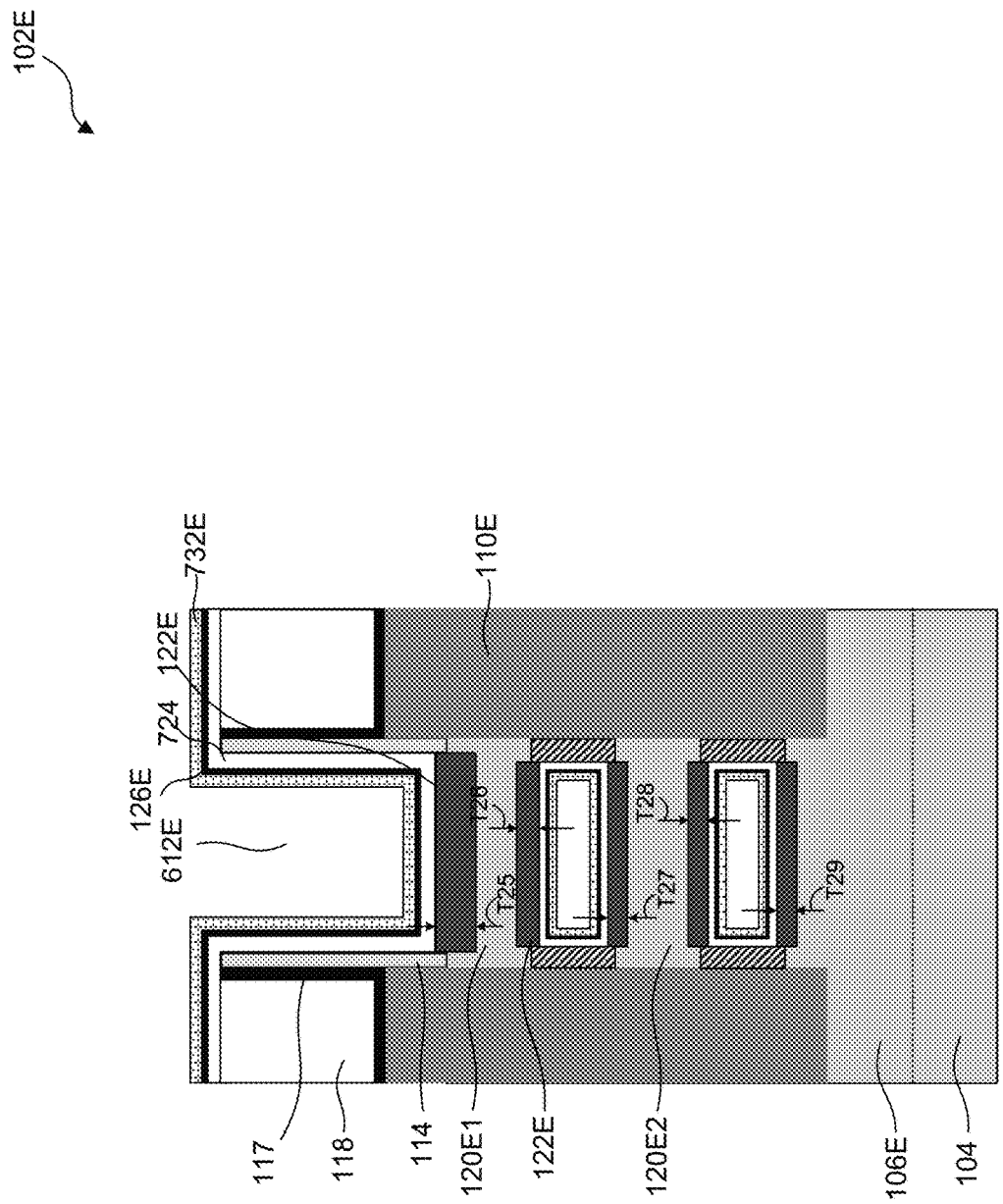

Referring to FIG. 2, in operation 215, gate openings are formed on and within the superlattice structures. For example, as shown in FIGS. 6A-6E, gate openings 612A-612E are formed. The formation of gate openings 612A-612B can include etching polysilicon structures 312A-312B and nanostructured layers 122A1-122A2 and 122B1-122B2 from the structures of FIGS. 5A-5B. Similar operations can be performed to form gate openings 612C-612E, as shown in FIGS. 6C-6E.

Referring to FIG. 2, in operations 220-230, gate-all-around (GAA) structures are formed in the gate openings. For example, based on operations 220-230, gate structures 112A-112E can be formed, as described with reference to FIGS. 7A-9E, 10A-12B, and 13A-15E.

Referring to FIG. 2, in operation 220, gate oxide structures are formed within the gate openings. For example, as described with reference to FIGS. 7A-9E, gate oxide structures 127A-127E are formed within gate openings 612A-612E. The formation of gate oxide structures 127A-127E can include sequential operations of (i) forming first IO layers 722A-722E within respective gate openings 612A-612E by performing a first oxidation process on the structures of FIGS. 6A-6E, as shown in FIGS. 7A-7E, (ii) depositing a HK gate dielectric layer 724 within gate openings 612A-612E, as shown in FIGS. 7A-7E, (iii) selectively forming capping layers 732A-732E within respective gate openings 612A-612E, as shown in FIGS. 7A-7E, (iv) forming first IO layers 122A-122E and second IO layers 126A-126E by performing a second oxidation process on the structures of FIGS. 7A-7E, as shown in FIGS. 8A-8E, and (v) removing capping layers 732A-732E from the structures of FIGS. 8A-8E to form the structures of FIGS. 9A-9E.

The first oxidation process can include oxidizing the surfaces of nanostructured channel regions 120A1-120A2, 120B1-120B2, 120C1-120C2, 120D1-120D2, and 120E1-120E2 that are exposed within gate openings 612A-612E in an oxidizing ambient. The oxidizing ambient can include a combination of ozone ($O_3$), a mixture of ammonia hydroxide, hydrogen peroxide, and water ("SC1 solution"), and/or a mixture of hydrochloric acid, hydrogen peroxide, water ("SC2 solution"). In some embodiments, the first oxidation process can be performed at a first oxidation temperature ranging from about 30° C. to about 200° C. Other temperature ranges are within the scope of the disclosure.

During the first oxidation process, the oxidation rates of nanostructured channel regions 120A1-120A2, 120B1-120B2, 120C1-120C2, 120D1-120D2, and 120E1-120E2 can be substantially equal. As a result, first IO layers 722A-722E are grown to thicknesses that are substantially equal to each other. First IO layers 722A-722E form respective first IO layers 122A-122E in subsequent second oxidation process. During the second oxidation process, nanostructured channel regions 120A1-120A2, 120B1-120B2, 120C1-120C2, 120D1-120D2, and 120E1-120E2 are further oxidized to grow first IO layers 722A-722E into respective first IO layers 122A-122E with thicknesses that are different from each other. The oxidation rates of nanostructured channel regions 120A1-120A2, 120B1-120B2, 120C1-120C2, 120D1-120D2, and 120E1-120E2 are different from each other during the second oxidation process. The second oxidation process can include substantially simultaneously exposing the structures of FIGS. 7A-7E to a gas mixture of oxygen and nitrogen, steam, or other suitable oxidizing agents at a second oxidation temperature ranging from about 800° C. to about 900° C., which is higher than the first oxidation temperature. Other temperature ranges are within the scope of the disclosure. In some embodiments, the second oxidation process can be an in-situ process or an ex-situ process.

In some embodiments, first IO layers 722A-722E are grown into respective first IO layers 122A-122E with thicknesses that are different from each other due to the different oxygen diffusivities of capping layers 732A-732E and/or second IO layers 126A-126E, which are formed at the interfaces between HK gate dielectric layer 724 and capping layers 732A-732E during the second oxidation process. The different oxygen diffusivities of capping layers 732A-732E and/or second IO layers 126A-126E result in the different oxidation rates of nanostructured channel regions 120A1-120A2, 120B1-120B2, 120C1-120C2, 120D1-120D2, and 120E1-120E2 during the second oxidation process. The oxygen diffusivities of capping layers 732A-732E and/or second IO layers 126A-126E is directly proportional to the respective oxidation rates of nanostructured channel regions 120A1-120A2, 120B1-120B2, 120C1-120C2, 120D1-120D2, and 120E1-120E2. As a result, in some embodiments, to achieve the relative thicknesses of first IO layers 122A-122E, capping layer 732E can have an oxygen diffusivity higher than that of capping layer 732D, which can have an oxygen diffusivity higher than that of capping layer 732C, which can have an oxygen diffusivity higher than that of capping layer 732B, which can have an oxygen diffusivity higher than that of capping layer 732A. In some embodiments, capping layers 732A-732E can include titanium silicon nitride (TiSiN), titanium nitride (TiN), tantalum nitride (TaN), aluminum nitride (AlN), and tungsten nitride (WN), respectively, to achieve the relative thicknesses of first IO layers 122A-122E. In some embodiments, capping layers 732A-732E can have thicknesses substantially equal to each other. The selective formation of capping layers 732A-732E can include using lithographic processes.

The removal of capping layer 732A-732E can include performing an atomic layer etch (ALE) process using tungsten pentachloride (WCl) or tantalum pentachloride ($TaCl_5$) gas, $O_2$ gas, and argon gas or other suitable gases on the structures of FIGS. 8A-8E at the same time. In some embodiments, each cycle of the ALE process can include sequential periods of: (i) first etching gas (e.g., $WCl_5$ or $TaCl_5$) flow, (ii) a first purging process with argon gas, (iii) a second etching gas (e.g., $O_2$) gas flow, and (iv) a second purging process with argon gas. In some embodiments, the ALE process can include sequential operations of (i) predicting an etching recipe using a training module 1570 of an ALE control system 1500 shown in FIG. 15, (ii) based on the predicted etching recipe, adjusting the process parameters of an etching apparatus (not shown) using a communication module 1572 of ALE control system 1500, (iii) based on the adjusted process parameters, etching capping layer 732A-732E with the etching apparatus, (iv) measuring the thicknesses of the remaining capping layer portions with a measurement system (not shown), (v) sending the measurement data to a memory 1574 of ALE control system 1500, (vi) analyzing the measurement data with an analysis module 1576 of ALE control system 1500 to determine if the thicknesses of the remaining capping layer portions are equal to about zero nm, and (vii) ending the etching process in the etching apparatus using a processor 1578 and/or communication module 1572 of ALE control system 1500 if the thicknesses are equal to about zero nm or repeating operations (i)-(vi) until the thicknesses are equal to about zero nm and capping layers 732A-732E are removed, as shown in FIGS. 9A-9E. In some embodiments, training module 1570, communication module 1572, memory 1574, analysis module 1576, and processor 1578 are wired to or wirelessly connected to each other. In some embodiments, the adjustment of the process parameters of the etching apparatus can include adjusting etching duration, etching gas flow, and/or etching temperature.

The prediction of the etching recipe with ALE control system 1500 can include performing a computing procedure to (i) analyze etching process data collected from previous etching processes performed on other structures with the etching apparatus, and (ii) predict, based on the analyzed data, the etching process characteristics (e.g., etching rate, etching duration) for etching capping layer 732A-732E with different etching process parameters (e.g., ampoule lifetime, temperature and humidity of etching chamber, light adsorption or reflection within the etching chamber, pressure within the etching chamber, carrier gas condition, etching gas supply pipe length, etc.). The computer procedure can include one or more mathematical operations, a pattern recognition procedure, a big data mining procedure, or a machine learning procedure, such as a neural network algorithm, to analyze the etching process data (e.g., ampoule lifetime, etching chamber lifetime, effective etching density, effective etching area size, etching gas parameters, etc.) and predict the etching process characteristics. Similarly, the analysis of the measurement data with ALE control system 1500 can include performing a computing procedure.

The discussion of HK gate dielectric layers 124A-124E applies to HK gate dielectric layer 724, unless mentioned otherwise. HK gate dielectric layer 724 form HK gate dielectric layers 124A-124E in subsequent processing. In some embodiments, HK gate dielectric layer 724 can be formed with an ALD process using hafnium chloride ($HfCl_4$) as a precursor at a temperature ranging from about 250° C. to about 350° C. Other temperature ranges are within the scope of the disclosure.

In some embodiments, instead of depositing HK gate dielectric layer 724 after the formation of first IO layers 722A-722B, HK gate dielectric layer 724 can be deposited after the removal of capping layers 732A-732E. That is, in some embodiments, the formation of gate oxide structures 127A-127E can include sequential operations of (i) forming first IO layers 722A-722E within respective gate openings 612A-612E by performing the first oxidation process on the structures of FIGS. 6A-6E, as shown in FIGS. 7A-7E, (ii) selectively forming capping layers 732A-732E on respective first IO layers 722A-722E, (iii) forming first IO layers 122A-122E by performing the second oxidation process, (iv) removing capping layers 732A-732E, and (v) depositing HK gate dielectric layer 724 on respective first IO layers 122A-122E.

Referring to FIG. 2, in operation 225, a WFM layer is formed on the gate oxide structures. For example, as shown in FIGS. 10A-10B, WFM layer 128 is formed on gate oxide structures 127A-127B. The deposition of WFM layer 128 can include depositing about 1 nm to about 3 nm thick WFM layer 128 on the structures of FIGS. 9A-9B with an ALD or a CVD process using titanium tetrachloride ($TiCl_4$) and titanium ethylene aluminum (TEAl) or tantalum chloride (TaCl5) and trimethylaluminium (TMA) as precursors at a temperature ranging from about 350° C. to about 450° C. Other thickness ranges of WFM layer 128 and temperature ranges are within the scope of the disclosure. In some embodiments, WFM layer 128 can be deposited in an ALD process of about 4 cycles to about 12 cycles, where one cycle can include sequential periods of: (i) first precursor gas (e.g., $TiCl_5$ or $TaCl_4$) flow, (ii) a first gas purging process, (iii) a second precursor gas (e.g., TEAl or TMA) gas flow, and (iv) a second gas purging process.

Figure 10B:
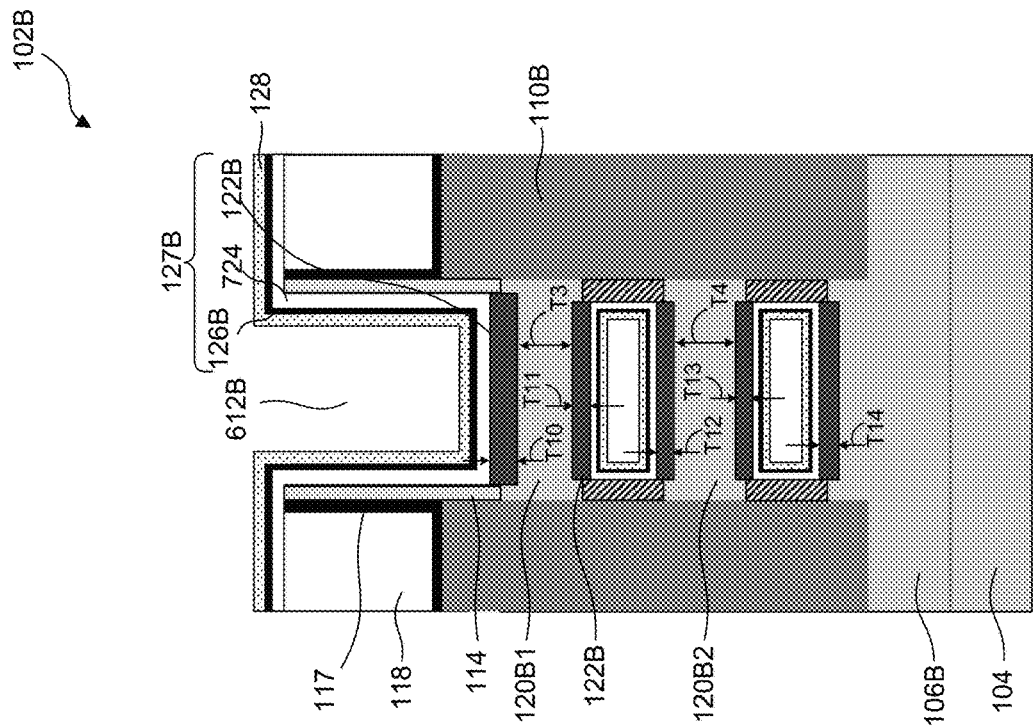
Figure 10A:
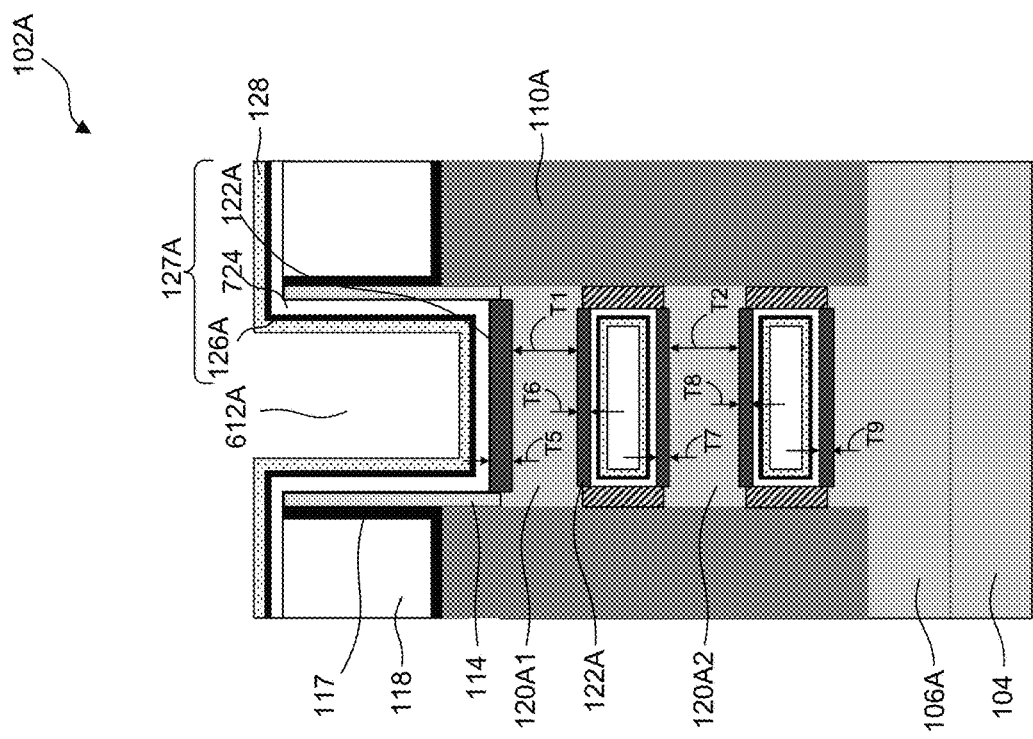
Figure 11B:
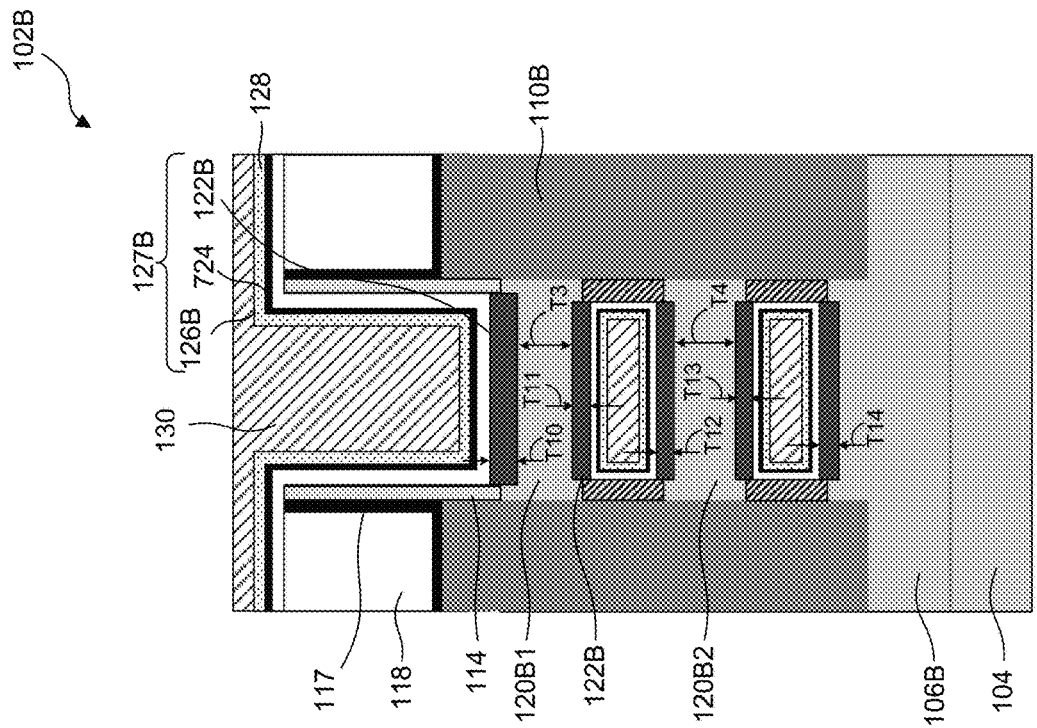
Figure 11A:
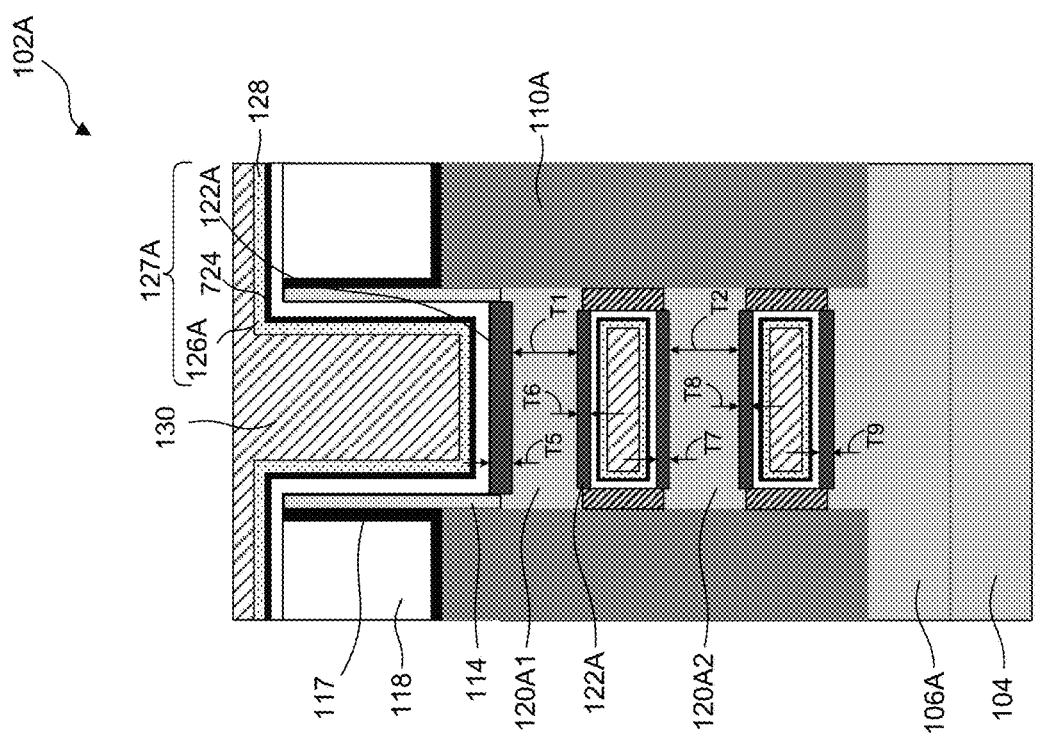

Referring to FIG. 2, in operation 230, a gate metal fill layer is deposited on the WFM layer. For example, as shown in FIGS. 11A-11B, a gate metal fill layer 130 is deposited on WFM layer 128. The deposition of gate metal fill layer 130 can include depositing a fluorine-free metal layer (e.g., a fluorine-free tungsten layer) on the structures of FIGS. 10A-10B at the same time. The deposition of the fluorine-free metal layer can include depositing the fluorine-free metal layer with an ALD process using $WCl_5$ or $WCl_6$ and $H_2$ as precursors at a temperature ranging from about 400° C. to about 500° C. Other temperature ranges are within the scope of the disclosure. In some embodiments, the fluorine-free metal layer can be deposited in an ALD process of about 160 cycles to about 320 cycles, where one cycle can include sequential periods of: (i) a first precursor gas (e.g., $WCl_5$ or $WCl_6$) flow, (ii) a first gas purging process, (iii) a second precursor gas (e.g., $H_2$) flow, and (iv) a second gas purging process.

Figure 12B:
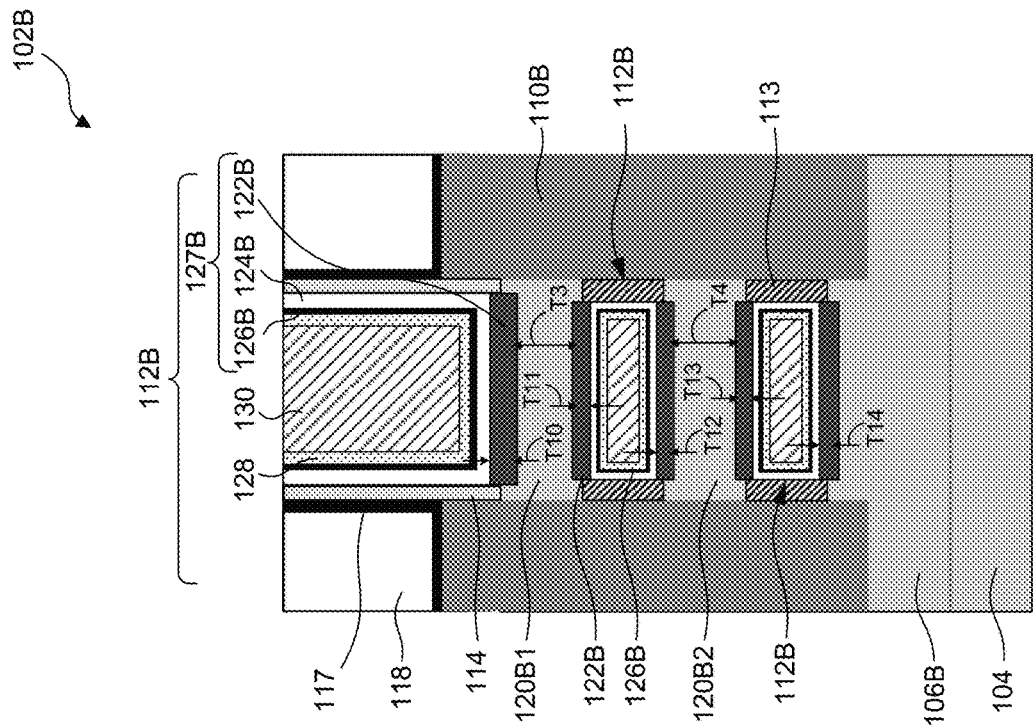
Figure 12A:
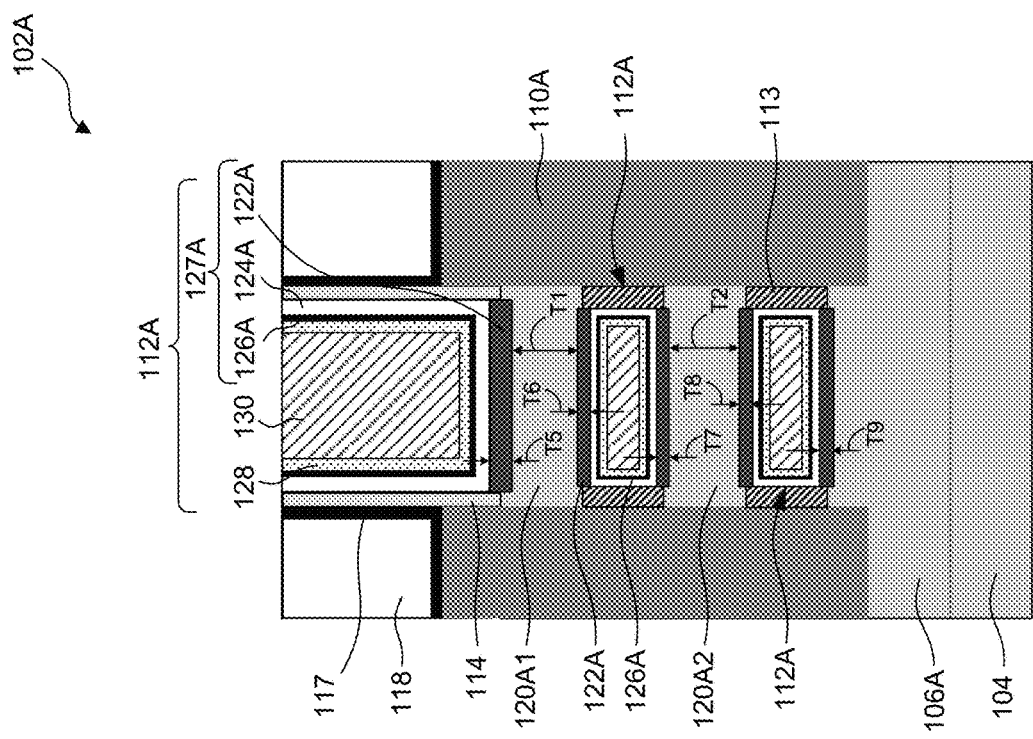
Figure 13D:
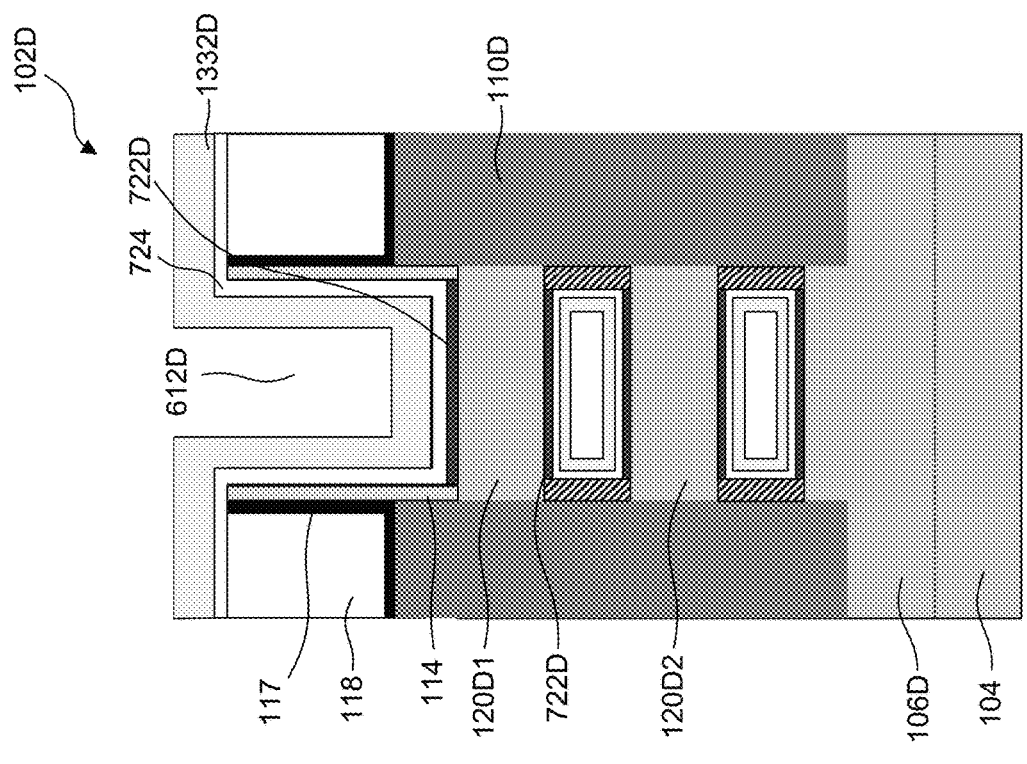
Figure 13C:
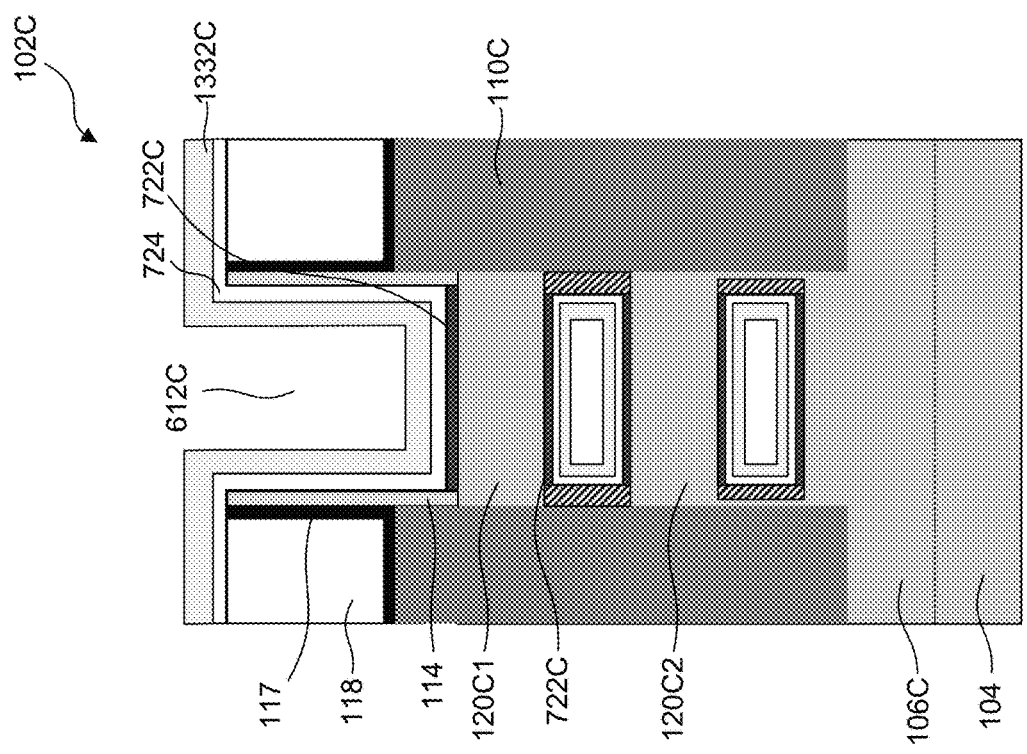
Figure 13E:
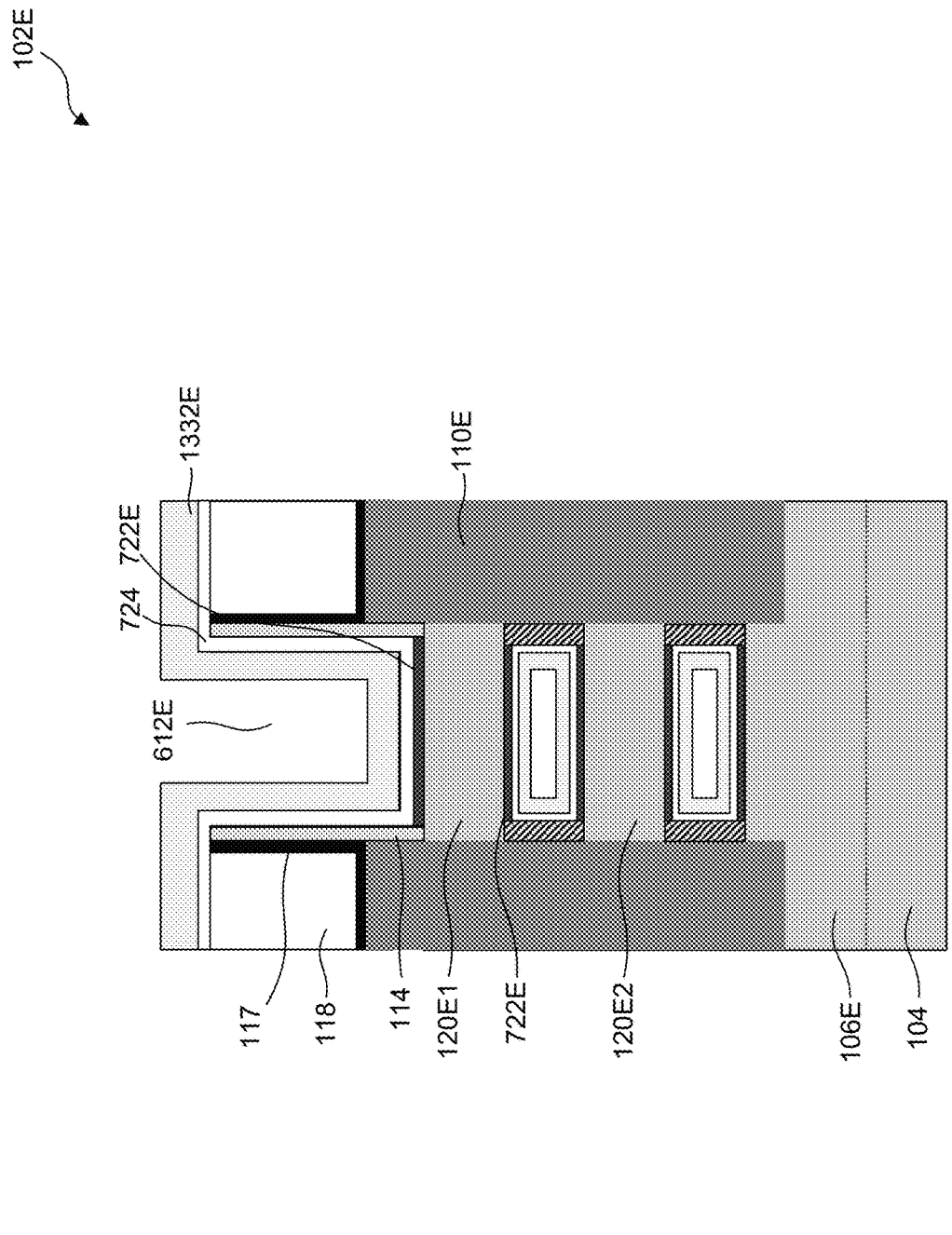
Figure 14D:
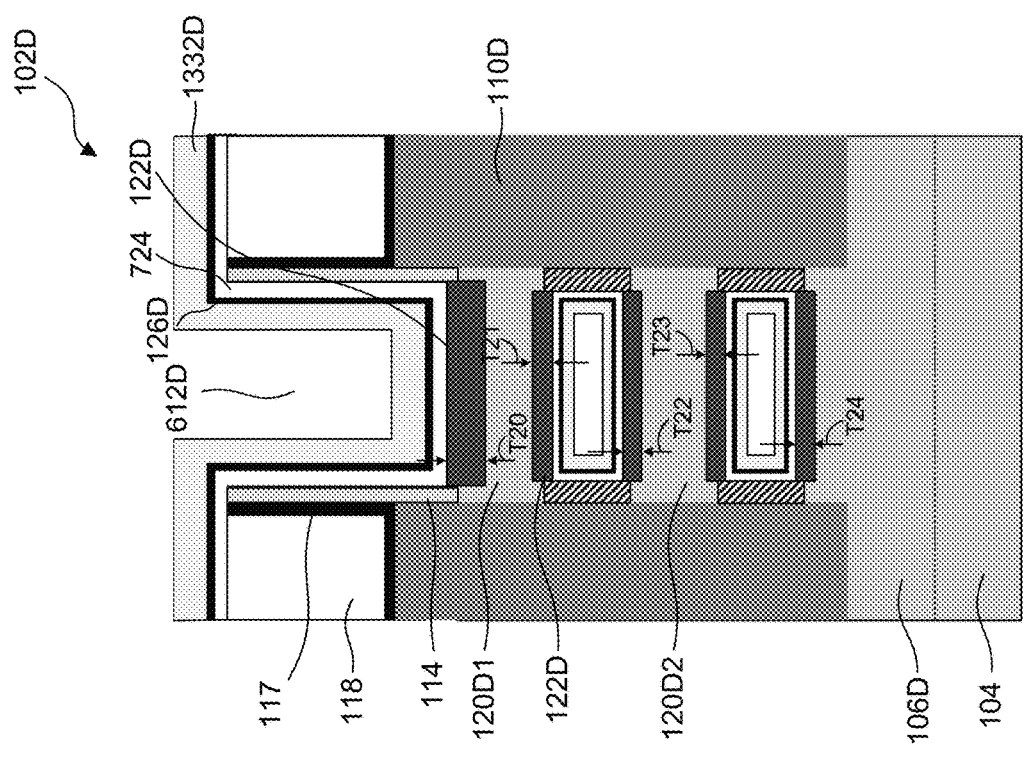
Figure 14C:
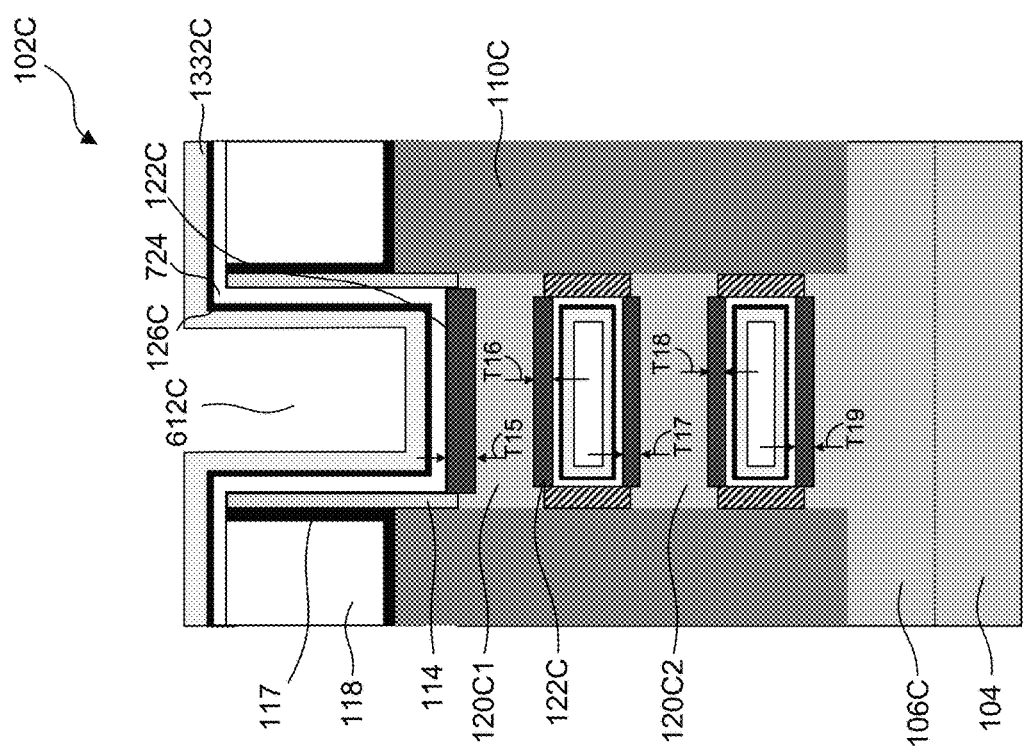
Figure 14E:
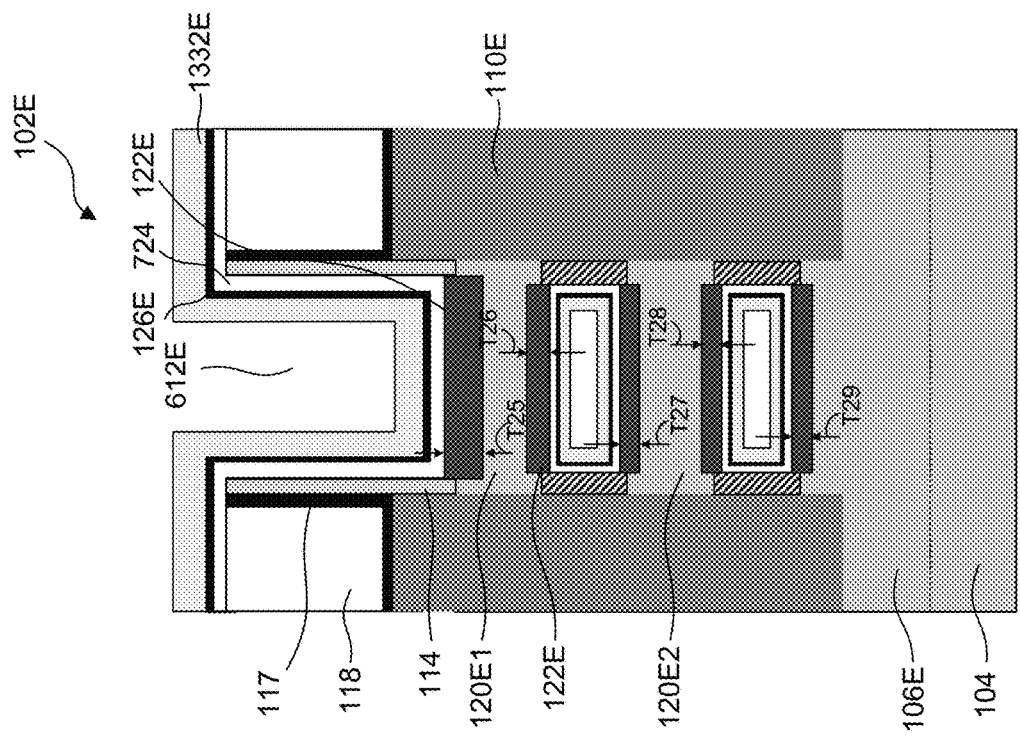
Figure 15:
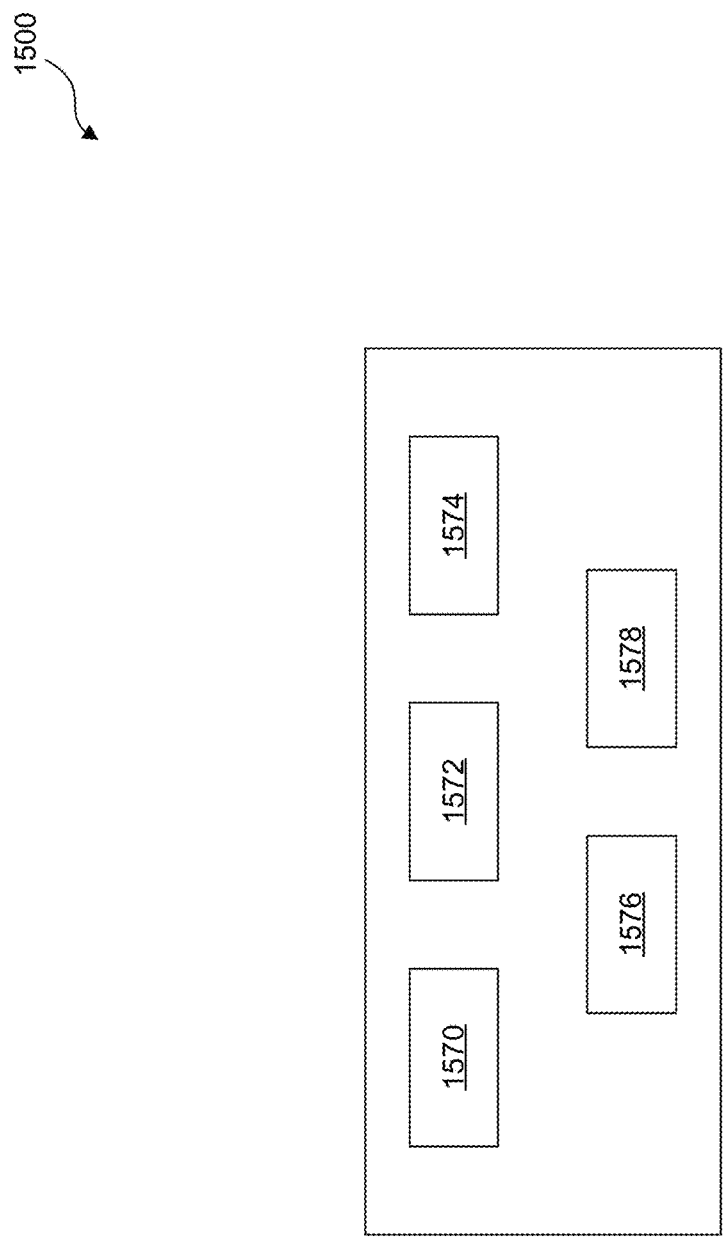
FIG. 15 illustrates a block diagram of a control system of an atomic layer etch (ALE) system, in accordance with some embodiments.

After the deposition of gate metal fill layer 130, HK gate dielectric layer 724, second IO layers 126A-126B, WFM layer 128, and gate metal fill layer 130 can be polished by a chemical mechanical polishing (CMP) process to substantially coplanarize top surfaces of HK gate dielectric layer 724, second IO layers 126A-126B, WFM layer 128, and gate metal fill layer 130 with a top surface of ILD layer 118, as shown in FIGS. 12A-12B. In some embodiments, after the CMP process, contact structures can be formed.

Figure 1H:
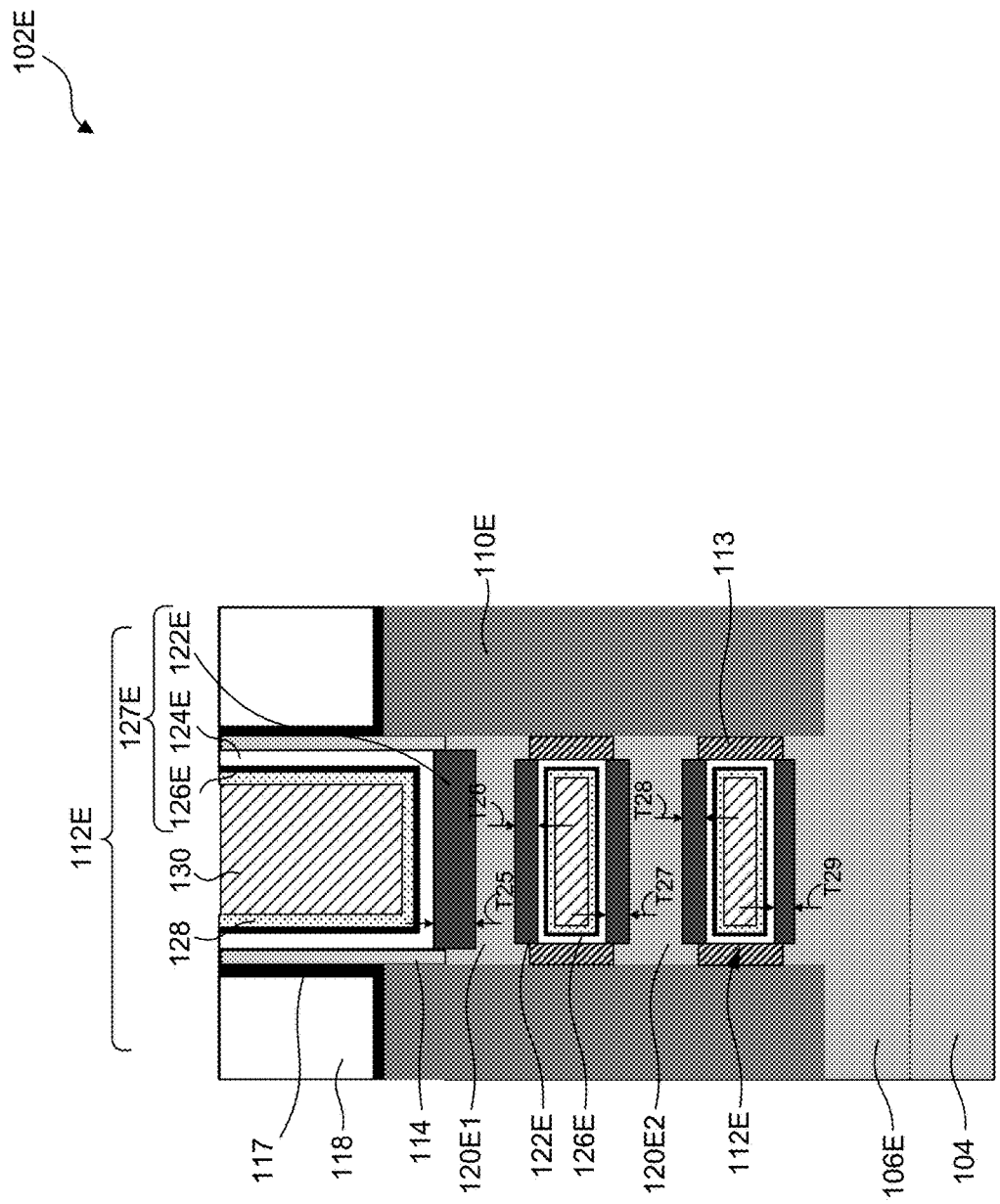
Figure 1H:
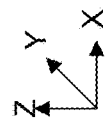
Figure 9B:
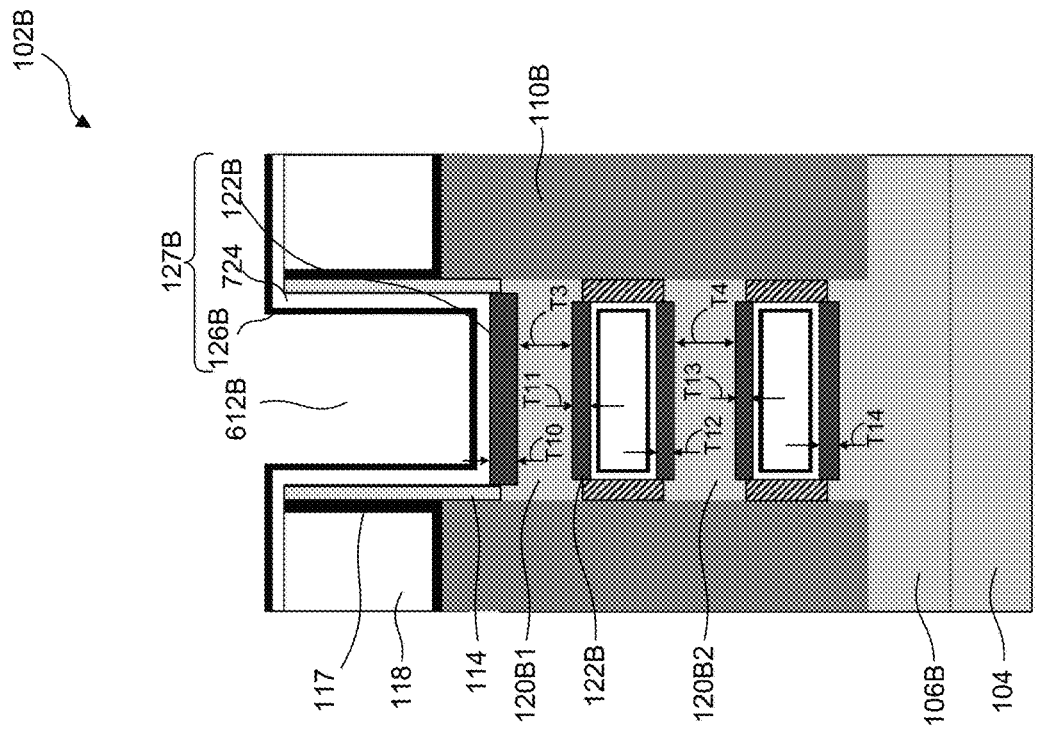
Figure 9A:
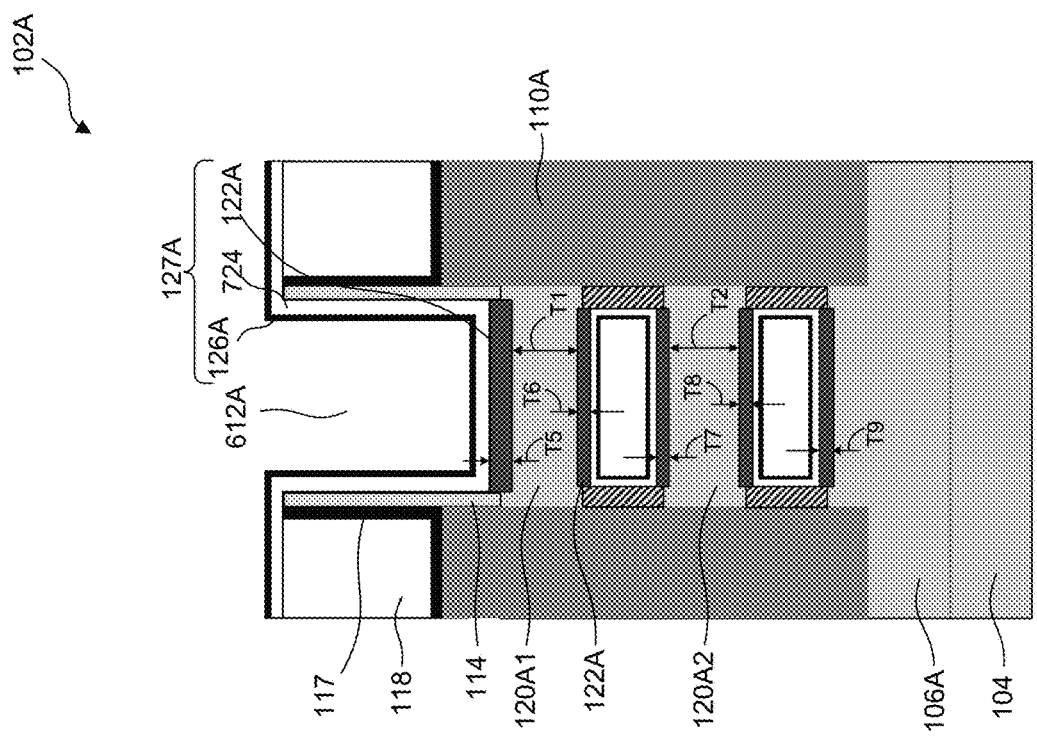
Figure 9D:
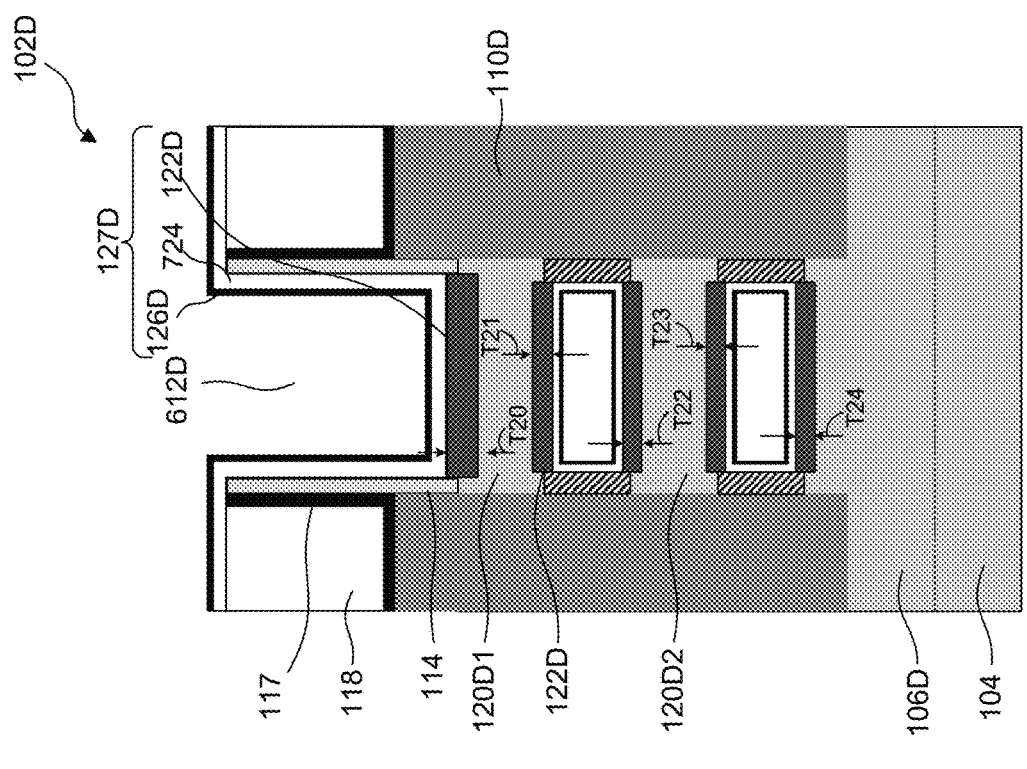
Figure 9C:
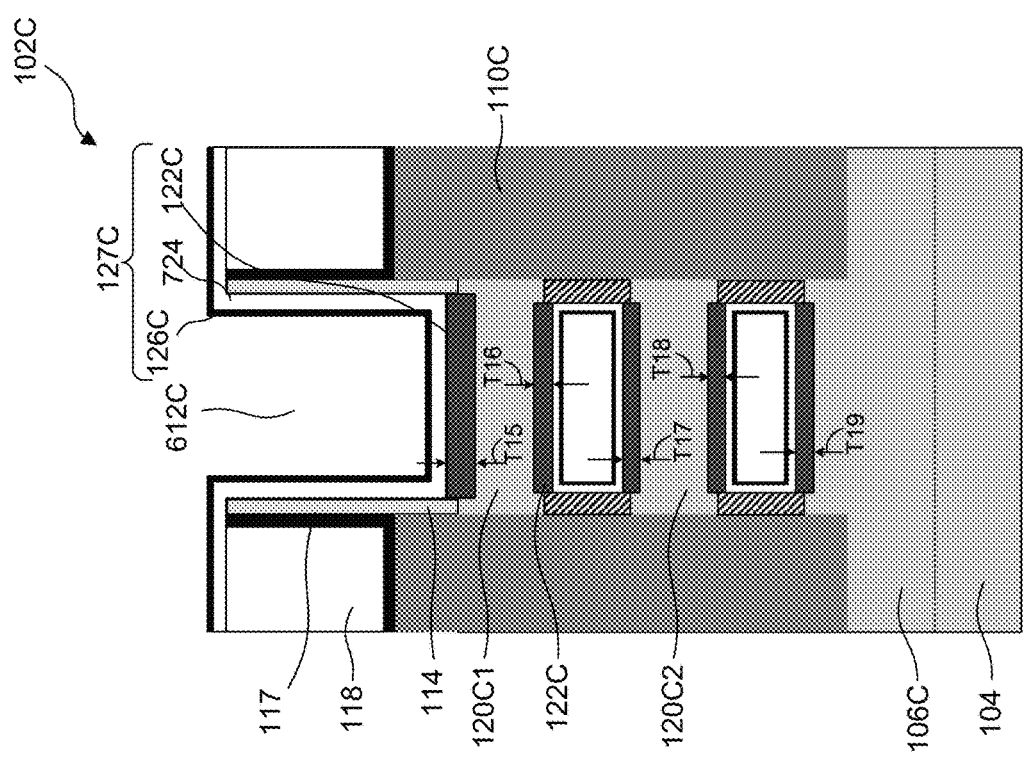
Figure 9E:
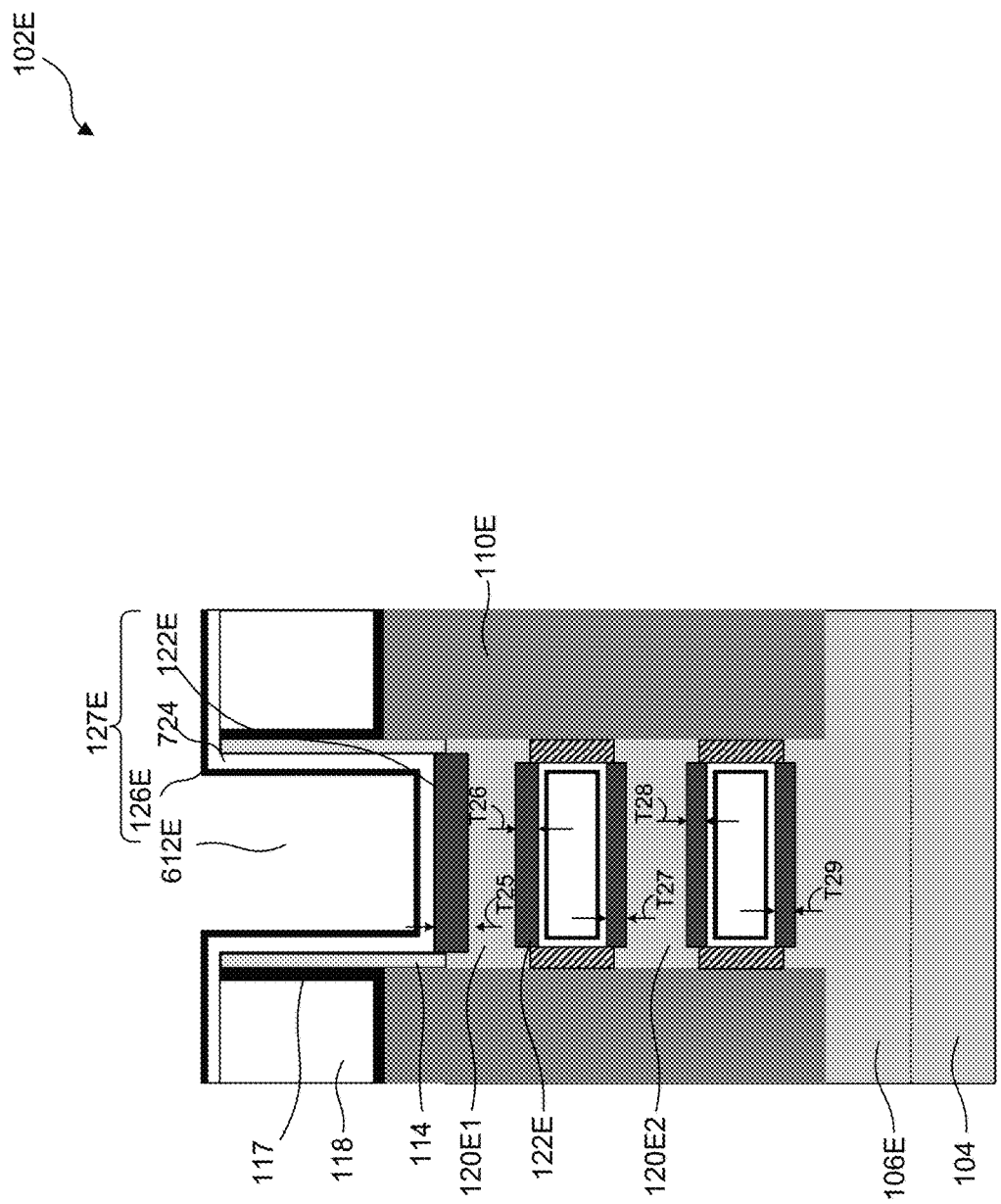

Though operations 225-230 are shown to be performed on the structures of FIGS. 9A-9B, operations 225-230 can also be performed on the structures of FIGS. 9C-9E to form FETs 102C-102E as shown in FIGS. 1F-1H.

In some embodiments, in operation 220, instead of selectively forming capping layers 732A-732E of different materials, capping layers 1332A-133E of the same material with different thicknesses can be selectively formed on HK gate dielectric layer 724 using a lithographic process, as shown in FIGS. 13A-13E. In some embodiments, to achieve the relative thicknesses of first IO layers 122A-122E, capping layer 1332E can be thicker than capping layer 1332D, which can be thicker than capping layer 1332C, which can be thicker than capping layer 1332B, which can be thicker than capping layer 1332A. The second oxidation process can be performed on the structures of FIGS. 13A-13E, instead of on the structures of FIGS. 7A-7E, to grow first IO layers 722A-722E into respective first IO layers 122A-122E with thicknesses that are different from each other, as shown in FIGS. 14A-14E. Second IO layers 126A-126E of FIGS. 14A-14E can have the same material.

The present disclosure provides an example semiconductor device (e.g., semiconductor device 100) with FETs (e.g., FETs 102A-102E) having different gate structure configurations that provide different levels of power consumption. The present disclosure also provides example methods (e.g., method 200) of forming such FETs on a same substrate (e.g., substrate 104). The example methods form FET gate structures (e.g., gate structures 112A-112E) with different gate oxide structures (e.g., gate oxide structures 127A-127E) for forming FETs with different levels of power consumption on the same substrate. These example methods can be more cost-effective (e.g., cost reduced by about 20% to about 30%) and time-efficient (e.g., time reduced by about 15% to about 20%) in manufacturing reliable FET gate structures with low and/or ultra-low levels (e.g., in the ranges of microwatts, nanowatts, or picowatts) of power consumption than other methods of forming FETs with similar levels of power consumption on the same substrate. In addition, these example methods can form FET gate structures with smaller dimensions (e.g., smaller gate length) without increasing gate resistance than other methods of forming FETs with similar levels of power consumption.

In some embodiments, each of the FET gate oxide structures includes a HK gate dielectric layer (e.g., HK gate dielectric layer 124) interposed between first and second IO layers (e.g., first IO layers 122A-122E and second IO layers 126A-126E). The first IO layers can be formed with thicknesses different from each other to achieve different levels of power consumption in different FETs. In some embodiments, the first IO layers of different thicknesses can be formed in two oxidation processes. In the first oxidation process, the first IO layers can be formed with thicknesses substantially equal to each other. In the second oxidation process, the first IO layers can be grown to have thicknesses different from each other.

In some embodiments, the second oxidation process can include forming capping layers (e.g., capping layers 732A-732E or capping layers 1332A-1332E) on the HK gate dielectric layers and performing an in-situ or an ex-situ annealing process in an oxidizing ambient. The capping layers can be formed to have oxygen diffusivities different from each other. The capping layers can control the growth of the first IO layers during the in-situ or ex-situ annealing process. In some embodiments, the capping layers with different oxygen diffusivities can be formed with materials (e.g., metal nitrides, metal oxides, other suitable materials, or a combination thereof) different from each and having thicknesses substantially equal to each other or can be formed with the same material having thicknesses different form each other.

In some embodiments, a method includes forming first and second nanostructured channel regions on first and second fin structures, respectively, forming first and second oxide layers with first and second thicknesses, respectively, forming a high-k dielectric layer with first and second layer portions on the first and second oxide layers, respectively, forming first and second capping layers with first and second oxygen diffusivities on the first and second layer portions, respectively, growing the first and second oxide layers to have third and fourth thicknesses, and forming a gate metal fill layer over the high-k dielectric layer. The first and second thicknesses are substantially equal to each other and the first and second oxide layers surround the first and second nanostructured channel regions, respectively. The second oxygen diffusivity is higher than the first oxygen diffusivity. The fourth thickness is greater than the third thickness.

In some embodiments, a method includes forming first and second nanostructured channel regions on first and second fin structures, respectively, forming first and second gate oxide structures on the first and second nanostructured channel regions, respectively, and forming a gate metal fill layer over the first and second gate oxide structures. The forming the first and second gate oxide structures includes forming first and second oxide layers of a same material with thicknesses that are substantially equal to each other, forming first and second high-k dielectric layers of a same material, forming first and second capping layers with oxygen diffusivities different from each other, growing the first and second oxide layers to have thicknesses different from each other, and removing the first and second capping layers.

In some embodiments, a semiconductor device includes a substrate, first and second fin structures disposed on the substrate, first and second nanostructured channel regions disposed on the first and second fin structures, respectively, first and second gate oxide structures surrounding the first and second nanostructured channel regions, respectively, and first and second gate metal fill layers disposed over the first and second gate oxide structures, respectively. Dimensions of the second nanostructured channel region is smaller than dimensions of the first nanostructured channel region. The first and second gate oxide structures includes first and second oxide layers of a same material with thicknesses that are different from each other, first and second high-k dielectric layers disposed on the first and second oxide layers, respectively, and third and fourth oxide layers of different materials with thicknesses that are substantially equal to each other. The third and fourth oxide layers are disposed on the first and second high-k dielectric layers, respectively.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first gate structure, disposed on the substrate, comprising:
      a first oxide layer of a first thickness disposed on a first channel region,
      a second oxide layer of a second thickness disposed on the first oxide layer, and
      a first metal layer disposed on the second oxide layer; and
   a second gate structure, disposed on the substrate, comprising:
      a third oxide layer of a third thickness disposed on a second channel region,
      a fourth oxide layer of a fourth thickness disposed on the third oxide layer, and
      a second metal layer disposed on the fourth oxide layer,
   wherein:
      the first and third thicknesses are different from each other,
      the second and fourth thicknesses are substantially equal to each other, and
      a material of the second oxide layer is different from a material of the fourth oxide layer.

2. The semiconductor device of claim 1, further comprising a high-k dielectric layer disposed between the first oxide layer and the second oxide layer.

3. The semiconductor device of claim 1, further comprising a high-k dielectric layer disposed between the third oxide layer and the fourth oxide layer.

4. The semiconductor device of claim 1, further comprising a first dielectric layer disposed between the first oxide layer and the second oxide layer, wherein the first dielectric layer comprises rare-earth metal dopants.

5. The semiconductor device of claim 4, further comprising a second dielectric layer disposed directly on the first dielectric layer, wherein the second dielectric layer comprises a dielectric constant greater than a dielectric constant of the first dielectric layer.

6. The semiconductor device of claim 1, further comprising a layer of dipoles disposed between the first oxide layer and the second oxide layer.

7. The semiconductor device of claim 1, wherein a material of the first oxide layer is the same as a material of the third oxide layer.

8. The semiconductor device of claim 1, wherein a thickness of the first channel region is greater than a thickness of the second channel region.

9. The semiconductor device of claim 1, wherein the second and fourth oxide layers have oxygen diffusivities different from each other.

10. The semiconductor device of claim 1, wherein the second and fourth oxide layers have Gibbs energies different from each other.

11. A semiconductor device, comprising:
    a substrate;
    a first transistor, disposed on the substrate, comprising:
       a first nanostructured channel region,
       a first oxide layer surrounding the first nanostructured channel region, and
       a second oxide layer disposed on the first oxide layer, and
    a second transistor, disposed on the substrate, comprising:
       a second nanostructured channel region,
       a third oxide layer surrounding the second nanostructured channel region, and
       a fourth oxide layer disposed on the third oxide layer,
    wherein:
       a thickness of the first oxide layer is different from a thickness of the third oxide layer, and
       a thickness of the first nanostructured channel region is different from a thickness of the second nanostructured channel region.

12. The semiconductor device of claim 11, wherein the second oxide layer and the fourth oxide layer comprise oxynitride layers.

13. The semiconductor device of claim 11, further comprising:
a first dielectric layer comprising hafnium oxide disposed directly on the first oxide layer; and
a second dielectric layer comprising zirconium oxide disposed directly on the first dielectric layer.

14. The semiconductor device of claim 11, wherein the second and fourth oxide layers have oxygen diffusivities different from each other.

15. The semiconductor device of claim 11, wherein the second and fourth oxide layers have Gibbs energies different from each other.

16. The semiconductor device of claim 11, wherein a material of the first oxide layer is the same as a material of the third oxide layer.

17. A semiconductor device, comprising:
a substrate;
a first nanostructured channel region disposed on the substrate;
a second nanostructured channel region disposed on the first nanostructured channel region; and
a gate structure surrounding the first and second nanostructured channel regions, wherein the gate structure comprises:
first and second oxide layers surrounding the first and second nanostructured channel regions, respectively;
first and second high-k dielectric layers disposed on the first and second oxide layers, respectively; and
third and fourth oxide layers disposed on the first and second high-k dielectric layers, respectively,
wherein a thickness of the second oxide layer is greater than a thickness of the first oxide layer, and
wherein a thickness of the second nanostructured channel region is greater than a thickness of the first nanostructured channel region.

18. The semiconductor device of claim 17, wherein the first oxide layer comprises an oxide of a material of the first nanostructured channel region.

19. The semiconductor device of claim 17, wherein the first high-k dielectric layer comprises:
a hafnium oxide layer disposed directly on the first oxide layer; and
a zirconium oxide layer disposed directly on the hafnium oxide layer.

20. The semiconductor device of claim 17, wherein the first high-k dielectric layer comprises rare earth metal dopants.

* * * * *

UNITED STATES PATENT AND TRADEMARK OFFICE
CERTIFICATE OF CORRECTION

PATENT NO. : 12,369,385 B2  
APPLICATION NO. : 18/600216  
DATED : July 22, 2025  
INVENTOR(S) : Cheng Page 1 of 1

It is certified that error appears in the above-identified patent and that said Letters Patent is hereby corrected as shown below:

On the Title Page

Column 1, Item (71), in "Applicant", Line 2, delete "Ltd." and insert -- Ltd., Hsinchu (TW) --, therefor.

In the Specification

In Column 7, Line 19, delete "HfO" and insert -- $HfO_2$ --, therefor.

In Column 7, Line 21, delete "ZrO" and insert -- $ZrO_2$ --, therefor.

In Column 8, Line 4, delete "ZrO or the stack of two layers with HfO" and insert -- ZrO2 or the stack of two layers with HfO2 --, therefor.

In Column 12, Line 1, delete "WCl" and insert -- $WCl_5$ --, therefor.

In Column 13, Line 29, delete "$TiCl_5$ or $TaCl_4$)" and insert -- $TiCl_4$ or $TaCl_5$) --, therefor.

Signed and Sealed this  
Sixteenth Day of September, 2025

Coke Morgan Stewart  
*Acting Director of the United States Patent and Trademark Office*